United States Patent
Mokhlesi et al.

(10) Patent No.: US 9,715,924 B2
(45) Date of Patent: Jul. 25, 2017

(54) THREE DIMENSIONAL NON-VOLATILE MEMORY WITH CURRENT SENSING PROGRAMMING STATUS

(71) Applicant: SANDISK TECHNOLOGIES LLC, Plano, TX (US)

(72) Inventors: Nima Mokhlesi, Los Gatos, CA (US); Ali Al-Shamma, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/299,338

(22) Filed: Oct. 20, 2016

(65) Prior Publication Data

US 2017/0117035 A1    Apr. 27, 2017

Related U.S. Application Data

(60) Provisional application No. 62/244,942, filed on Oct. 22, 2015.

(51) Int. Cl.
| | | |
|---|---|---|
| *G11C 16/34* | (2006.01) | |
| *G11C 11/56* | (2006.01) | |
| *G11C 16/08* | (2006.01) | |
| *G11C 16/04* | (2006.01) | |

(52) U.S. Cl.
CPC ...... *G11C 11/5628* (2013.01); *G11C 11/5642* (2013.01); *G11C 16/0483* (2013.01); *G11C 16/08* (2013.01); *G11C 16/3459* (2013.01)

(58) Field of Classification Search
CPC .................................................. G11C 16/3459
USPC ....................................... 365/185.19, 185.22
See application file for complete search history.

(56) References Cited

U.S. PATENT DOCUMENTS

| | | | |
|---|---|---|---|
| 5,606,527 | A | 2/1997 | Kwack |
| 5,616,961 | A | 4/1997 | Kohyama |
| 5,945,717 | A | 8/1999 | Chevallier |
| 6,005,802 | A | 12/1999 | Takeuchi et al. |
| 6,172,914 | B1 | 1/2001 | Haddad |
| 6,757,196 | B1 | 6/2004 | Tsao |
| 6,873,561 | B2 | 3/2005 | Ooishi |
| 7,002,843 | B2 | 2/2006 | Guterman |
| 7,020,026 | B2 | 3/2006 | Guterman |

(Continued)

FOREIGN PATENT DOCUMENTS

WO    WO2008/083162    7/2008

OTHER PUBLICATIONS

Forghani-Zadeh, et al., "Current-Sensing Techniques for DC-DC Converters," The 2002 45th Midwest Symposium on Circuits and Systems, Aug. 2002.

(Continued)

*Primary Examiner* — Hoai V Ho
*Assistant Examiner* — Jay Radke
(74) *Attorney, Agent, or Firm* — Vierra Magen Marcus LLP

(57) ABSTRACT

A non-volatile memory system includes a plurality of non-volatile memory cells, one or more control circuits that perform programming of the memory cells, a power supply line that provides a supply used to program the memory cells, and a current measurement circuit. The current measurement circuit senses an indication of current on the power supply line. The one or more control circuits determine whether the programming of the memory cells is successful based on the indication of current.

20 Claims, 25 Drawing Sheets

(56) References Cited

U.S. PATENT DOCUMENTS

| | | | |
|---|---|---|---|
| 7,068,539 B2 | 6/2006 | Guterman | |
| 7,088,621 B2 | 8/2006 | Guterman | |
| 7,139,198 B2 | 11/2006 | Guterman | |
| 7,280,408 B2 | 10/2007 | Guterman | |
| 7,301,810 B2 | 11/2007 | Chen | |
| 7,349,264 B2 | 3/2008 | Mokhlesi | |
| 7,414,887 B2 | 8/2008 | Guterman | |
| 7,447,075 B2 | 11/2008 | Guterman | |
| 7,453,730 B2 | 11/2008 | Guterman | |
| 7,460,406 B2 | 12/2008 | Mokhlesi | |
| 7,514,321 B2 | 4/2009 | Mokhlesi | |
| 7,518,928 B2 | 4/2009 | Guterman | |
| 7,545,681 B2 | 6/2009 | Li | |
| 7,575,973 B2 | 8/2009 | Mokhlesi | |
| 7,616,481 B2 | 11/2009 | Mokhlesi | |
| 7,619,930 B2 | 11/2009 | Mokhlesi | |
| 7,660,162 B2 | 2/2010 | Cho | |
| 7,745,265 B2 | 6/2010 | Mokhlesi | |
| 7,808,038 B2 | 10/2010 | Mokhlesi | |
| 7,848,145 B2 | 12/2010 | Mokhlesi | |
| 7,851,851 B2 | 12/2010 | Mokhlesi | |
| 7,852,675 B2 | 12/2010 | Maejima | |
| 8,059,456 B2 | 11/2011 | Shlick | |
| 8,279,650 B2 | 10/2012 | Yan | |
| 8,509,000 B2 | 8/2013 | Sharon | |
| 9,117,549 B1 | 8/2015 | Yoo | |
| 2005/0106809 A1 | 5/2005 | Shea | |
| 2006/0279996 A1 | 12/2006 | Yu | |
| 2008/0130379 A1 | 6/2008 | Ohsawa | |
| 2010/0008126 A1 | 1/2010 | Toda | |
| 2010/0091568 A1* | 4/2010 | Li | G11C 11/5628 365/185.09 |
| 2011/0188314 A1 | 8/2011 | Kuo | |
| 2011/0199838 A1 | 8/2011 | Terada | |
| 2011/0233644 A1 | 9/2011 | Fukuzumi | |
| 2012/0020155 A1 | 1/2012 | Kim | |
| 2012/0199895 A1 | 8/2012 | Nitta | |
| 2013/0088919 A1 | 4/2013 | Kim | |
| 2013/0176790 A1 | 7/2013 | Nguyen | |
| 2014/0293701 A1 | 10/2014 | Dong | |
| 2015/0071006 A1 | 3/2015 | Harada | |
| 2015/0092479 A1 | 4/2015 | Dong | |
| 2016/0049196 A1 | 2/2016 | Choi | |
| 2016/0141301 A1 | 5/2016 | Mokhlesi | |

OTHER PUBLICATIONS

Lee, et al., "CMOS Continuous-Time Current-Mode Filters for High-Frequency Applications," IEEE Journal of Solid-State Circuits, vol. 28, Issue: 3, Mar. 1993.

Lee, et al., "On-Chip Current Sensing Technique for CMOS Monolithic Switch-Mode Power Converters," IEEE Xplore Conference: IEEE International Symposium on Circuits and Systems, 2002, vol. 5.

Lee et al., "A Monolithic Current-mode CMOS DC-DC Converter with On-Chip Current-Sensing Technique," IEEE Journal of Solid-State Circuits, vol. 39, No. 1, pp. 3-14, Jan. 2004.

Gabai, "On-Chip Current Sensing Technique for Cmos Monolithic Switch-Mode Power Converters, Problems in Circuits Design," Jun. 2006.

Aochi, "BiCS Flash as a Future 3D Non-volatile Memory Technology for Ultra High Density Storage Devices," Center for Semiconductor Research & Development, Semiconductor Company, Toshiba Corporation, May 2009.

Kim, et al., "A stacked memory device on logic 3D technology for ultra-high-density data storage," Nanotechnology, vol. 22, No. 25, May 2011.

Nitayama, "Bit Cost Scalable (BiCS) Flash Technology for Future Ultra High Density Storage Devices," Device Process Development Center, Corporate Research & Development Center, Toshiba Corporation, VLSI Technology Systems and Applications, Apr. 2010.

PCT Invitation to Pay Additional Fees and, Where Applicable, Protest Fee, Communication Relating to the Results of the partial International Search, dated Feb. 25, 2016, PCT Patent Application PCT/US2015/057742.

PCT International Search Report dated May 3, 2016, PCT Patent Application PCT/US2015/057742.

PCT Written Opinion of the International Searching Authority dated May 3, 2016, PCT Patent Application PCT/US2015/057742.

PCT International Search Report dated Jan. 11, 2017, PCT Patent Application PCT/US2016/058092.

PCT Written Opinion of the International Searching Authority Jan. 11, 2017, PCT Patent Application PCT/US2016/058092.

* cited by examiner

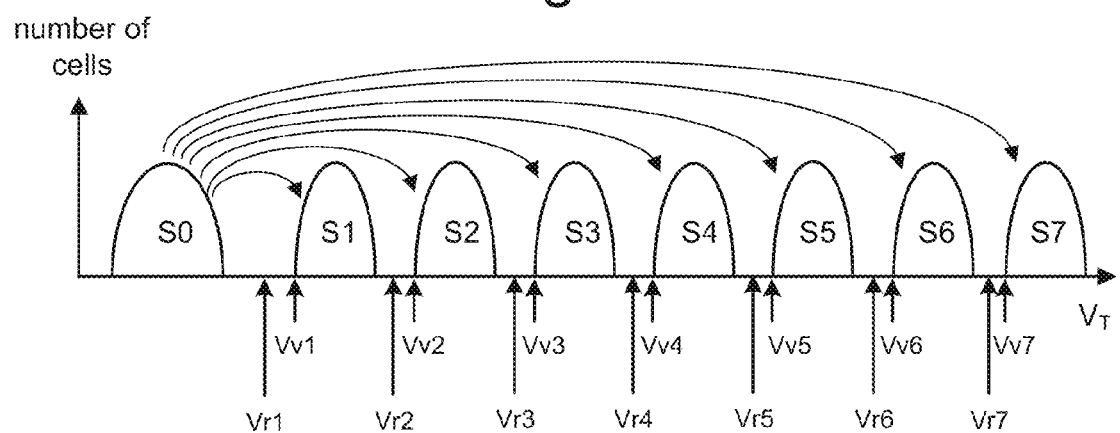
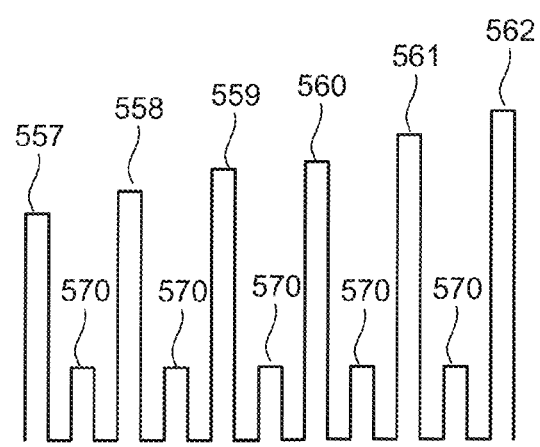

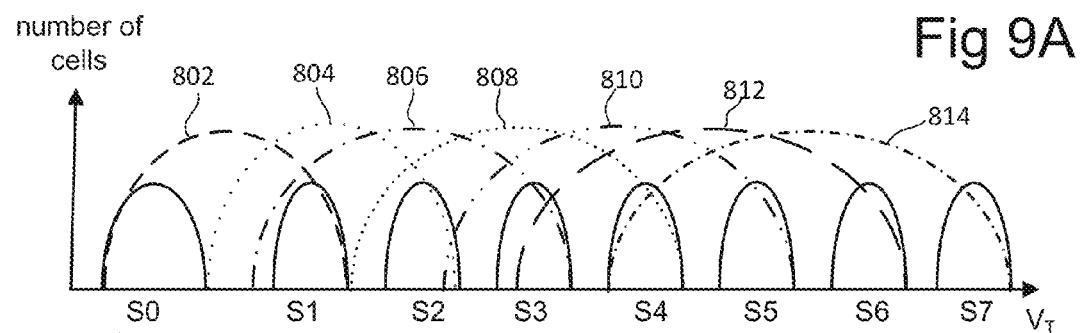
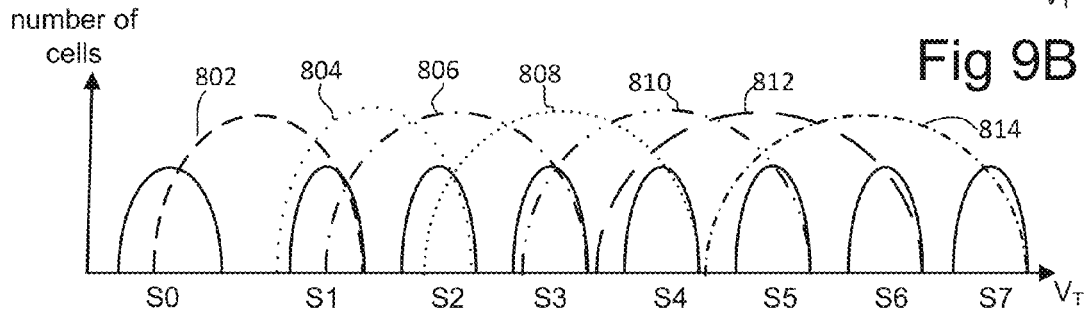
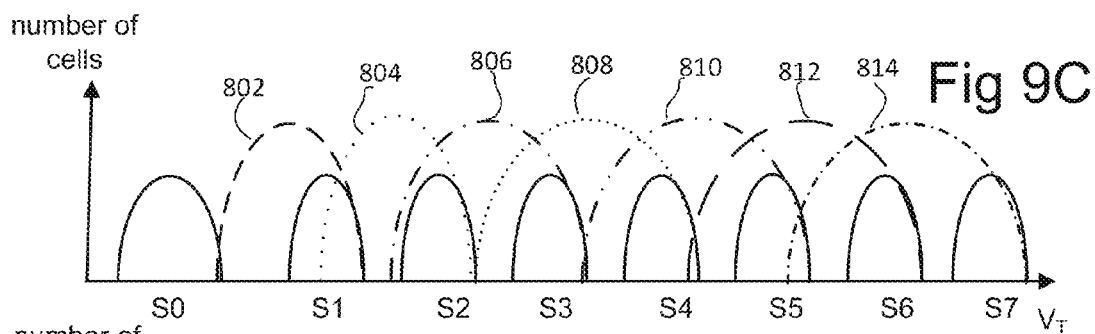
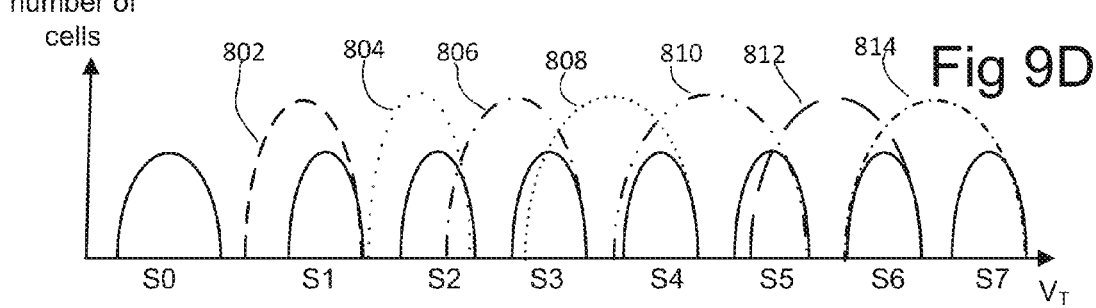
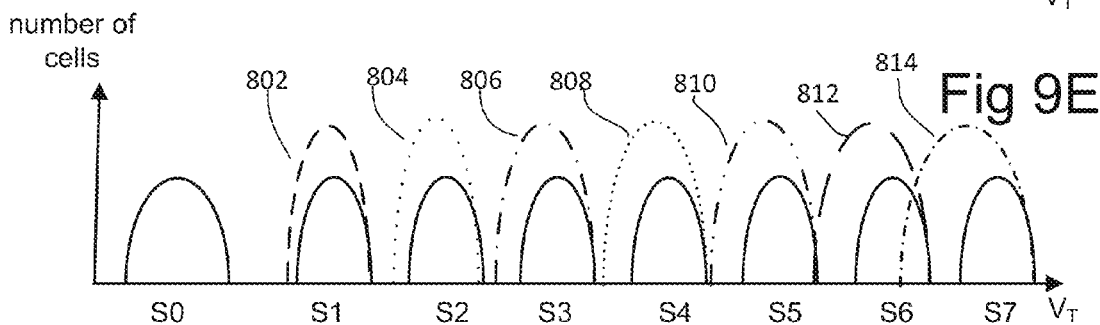

Fig 11

| State | Source Line Voltage: SL (V) | | | | Bit Line Voltage: BL (V) | | | |
|---|---|---|---|---|---|---|---|---|
| | Program | Inhibit | Verify | Lockout | Read | Program | Inhibit | Verify | Lockout | Read |
| S0 | 6.0 | 6.0 | 6.0 | 6.0 | 0.0 | 6.0 | 6.0 | 6.0 | 6.0 | 0.5 |
| S1 | 4.8 | 6.0 | 4.8 | 6.0 | 0.0 | 4.8 | 6.0 | 5.3 | 6.0 | 0.5 |
| S2 | 4.0 | 6.0 | 4.0 | 6.0 | 0.0 | 4.0 | 6.0 | 4.5 | 6.0 | 0.5 |
| S3 | 3.2 | 6.0 | 3.2 | 6.0 | 0.0 | 3.2 | 6.0 | 3.7 | 6.0 | 0.5 |
| S4 | 2.4 | 6.0 | 2.4 | 6.0 | 0.0 | 2.4 | 6.0 | 2.9 | 6.0 | 0.5 |
| S5 | 1.6 | 6.0 | 1.6 | 6.0 | 0.0 | 1.6 | 6.0 | 2.1 | 6.0 | 0.5 |
| S6 | 0.8 | 6.0 | 0.8 | 6.0 | 0.0 | 0.8 | 6.0 | 1.3 | 6.0 | 0.5 |
| S7 | 0.0 | 6.0 | 0.0 | 6.0 | 0.0 | 0.0 | 6.0 | 0.5 | 6.0 | 0.5 |

Fig 12

| Line name | Prog/Inhibit | Verify | Read |
|---|---|---|---|
| VSGD | 6V | 8V | 4V |
| WL # ≥ N+1 | 9V | 6V | 7V |
| WLN | VPGM | 5.2V | VCGR |
| WL # ≤ N−1 | 9V | 12V | 7V |
| VSGS | 6V | 8V | 4V |

Figure 16

| stage | 1.1 | 1.2 | 1.3 | 1.4 | 1.5 | 1.6 | 1.7 | 2.1 | 2.2 | 2.3 | 2.4 | 2.5 | 2.6 | 2.7 |
|---|---|---|---|---|---|---|---|---|---|---|---|---|---|---|
| | BL/SL chrg up to VCC | BL/SL chrg up to target | lower SGD & SGS | WLs to VPASS | WL N to VPGM #1 | transition to verify | verify # 1 | BL/SL chrg up to VCC | BL/SL chrg up to target | lower SGD & SGS | WLs to VPASS | WL N to VPGM # 2 | transition to verify | verify # 2 |
| timing (µs) | ≥20 0→ | ≥20 min(x,VCC)→x | 10 | 10 | 15 | 15 | 10 | ≥20 x→x or x→VCC | ≥20 x→x or VCC→target | 10 | 10 | 15 | 15 | 10 |
| SLs | | | | | | | | | | | | | | |
| SGS0 | 0→8 | 8 | 8→6 | 6 | 6 | 6→8 | 8 | 8 | 8 | 8→6 | 6 | 6 | 6→8 | 8 |
| SGS1 | 0→8 | 8 | 8→6 | 6 | 6 | 6→8 | 8 | 8 | 8 | 8→6 | 6 | 6 | 6→8 | 8 |
| SGS2 | 0→8 | 8 | 8→6 | 6 | 6 | 6→8 | 8 | 8 | 8 | 8→6 | 6 | 6 | 6→8 | 8 |
| SGS3 | 0→8 | 8 | 8→6 | 6 | 6 | 6→8 | 8 | 8 | 8 | 8→6 | 6 | 6 | 6→8 | 8 |
| WLDS1 | 0→8 | 8 | 8→6 | 6→9 | 6 | 6→8 | 8 | 8 | 8 | 8→6 | 6→9 | 6 | 6→8 | 8 |
| WLDS2 | 0→8 | 8 | 8→6 | 6→9 | 6 | 6→8 | 8 | 8 | 8 | 8→6 | 6→9 | 6 | 6→8 | 8 |
| WL0 | 0→8 | 8 | 8 | 8→9 | 9 | 9→12 | 12 | 12→8 | 8 | 8 | 8→9 | 9 | 9→12 | 12 |
| WL < N-1 | 0→8 | 8 | 8 | 8→9 | 9 | 9→12 | 12 | 12→8 | 8 | 8 | 8→9 | 9 | 9→12 | 12 |
| WL N-1 | 0→6 | 6 | 6 | 6→9 | 9 | 9→12 | 12 | 12→6 | 6 | 6 | 6→9 | 9 | 9→12 | 12 |
| WL N | 0→3 | 3 | 3 | 3→9 | 9→VPGM | VPGM→5.2 | 5.2 | 5.2→3 | 3 | 3 | 3→9 | 9→VPGM | VPGM→5.2 | 5.2 |
| WL N+1 | 0→3 | 3 | 3 | 3→9 | 9 | 9→6 | 6 | 6→3 | 3 | 3 | 3→9 | 9 | 9→6 | 6 |
| WL > N+1 | 0→3 | 3 | 3 | 3→9 | 9 | 9→6 | 6 | 6→3 | 3 | 3 | 3→9 | 9 | 9→6 | 6 |
| WL47 | 0→3 | 3 | 3 | 3→9 | 9 | 9→6 | 6 | 6→3 | 3 | 3 | 3→9 | 9 | 9→6 | 6 |
| WLDD2 | 0→3 | 3 | 3 | 3→9 | 9 | 9→6 | 6 | 6→3 | 3 | 3 | 3→9 | 9 | 9→6 | 6 |
| WLDD1 | 0→3 | 3 | 3 | 3→9 | 6 | 6→8 | 8 | 8 | 8 | 3 | 3→9 | 9 | 9→6 | 6 |
| SGD3 | 0→8 | 8 | 8→6 | 6 | 6 | 6→8 | 8 | 8 | 8 | 8→6 | 6 | 6 | 6→8 | 8 |
| SGD2 | 0→8 | 8 | 8→6 | 6 | 6 | 6→8 | 8 | 8 | 8 | 8→6 | 6 | 6 | 6→8 | 8 |
| SGD1 | 0→8 | 8 | 8→6 | 6 | 6 | 6→8 | 8 | 8 | 8 | 8→6 | 6 | 6 | 6→8 | 8 |
| SGD0 | 0→8 | 8 | 8→6 | 6 | 6 | 6→8 | 8 | 8 | 8 | 8→6 | 6 | 6 | 6→8 | 8 |
| BLs | 0→ min(x,VCC) | min(x,VCC)→x | x | x | x | x | x→x+0.5 | x+0.5→x or x+0.5→VCC | x→x or VCC→6 | x or 6 | x or 6 | x or 6 | x or 6 | 8 x→x+0.5 or 6→6 |

Figure 18

| Electrode | S0 Prgrm | S0 Verify | S1 Prgrm | S1 Verify | S2 Prgrm | S2 Verify | S3 Prgrm | S3 Verify | S4 Prgrm | S4 Verify | S5 Prgrm | S5 Verify | S6 Prgrm | S6 Verify | S7 Prgrm | S7 Verify |
|---|---|---|---|---|---|---|---|---|---|---|---|---|---|---|---|---|
| SL: | 3.6V | 3.6V | 3.6V | 3.6V | 3.6V | 3.6V | 3.6V | 3.6V | 2.4V | 2.4V | 1.6V | 1.6V | 0.8V | 0.8V | 0.0V | 0.0V |
| 4 X SGS: | 3.6V | 6.4V | 3.6V | 6.4V | 3.6V | 6.4V | 3.6V | 6.4V | 3.6V | 6.4V | 3.6V | 6.4V | 3.6V | 6.4V | 3.6V | 6.4V |
| 2 X WLDS: | 3.6V | 5.4V | 3.6V | 5.4V | 3.6V | 5.4V | 3.6V | 5.4V | 3.6V | 5.4V | 3.6V | 5.4V | 3.6V | 5.4V | 3.6V | 5.4V |
| WL 0: | 9.0V | 9.6V | 9.0V | 9.6V | 9.0V | 9.6V | 9.0V | 9.6V | 9.0V | 9.6V | 9.0V | 9.6V | 9.0V | 9.6V | 9.0V | 9.6V |
| WL 1→N−1 | 9.0V | 9.6V | 9.0V | 9.6V | 9.0V | 9.6V | 9.0V | 9.6V | 9.0V | 9.6V | 9.0V | 9.6V | 9.0V | 9.6V | 9.0V | 9.6V |
| WL N: | VPGM | 5.2V | VPGM | 5.2V | VPGM | 5.2V | VPGM | 5.2V | VPGM | 5.2V | VPGM | 5.2V | VPGM | 5.2V | VPGM | 5.2V |
| WL N+1→46 | 6.0V | 3.6V | 6.0V | 3.6V | 6.0V | 3.6V | 6.0V | 3.6V | 6.0V | 3.6V | 6.0V | 3.6V | 6.0V | 3.6V | 6.0V | 3.6V |
| WL 47: | 6.0V | 3.6V | 6.0V | 3.6V | 6.0V | 3.6V | 6.0V | 3.6V | 6.0V | 3.6V | 6.0V | 3.6V | 6.0V | 3.6V | 6.0V | 3.6V |
| 2 X WLDD: | 3.6V | 5.4V | 3.6V | 5.4V | 3.6V | 5.4V | 3.6V | 5.4V | 3.6V | 5.4V | 3.6V | 5.4V | 3.6V | 5.4V | 3.6V | 5.4V |
| 4 X SGD: | 3.6V | 6.4V | 3.6V | 6.4V | 3.6V | 6.4V | 3.6V | 6.4V | 3.6V | 6.4V | 3.6V | 6.4V | 3.6V | 6.4V | 3.6V | 6.4V |
| BL: | 3.6V | 3.6V | 3.6V | 3.6V | 3.6V | 3.6V | 3.6V | 3.6V | 2.4V | 2.9V | 1.6V | 2.1V | 0.8V | 1.3V | 0.0V | 0.5V |

Figure 19

| Electrode | S0 Prgrm | S0 Verify | S1 Prgrm | S1 Verify | S2 Prgrm | S2 Verify | S3 Prgrm | S3 Verify | S4 Prgrm | S4 Verify | S5 Prgrm | S5 Verify | S6 Prgrm | S6 Verify | S7 Prgrm | S7 Verify |
|---|---|---|---|---|---|---|---|---|---|---|---|---|---|---|---|---|
| SL: | 2.8V | 2.8V | 1.6V | 1.6V | 0.8V | 0.8V | 0.0V | 0.0V | 2.8V | 2.8V | 2.8V | 2.8V | 2.8V | 2.8V | 2.8V | 2.8V |
| 4 X SGS: | 2.8V | 5.6V | 2.8V | 5.6V | 2.8V | 5.6V | 2.8V | 5.6V | 2.8V | 5.6V | 2.8V | 5.6V | 2.8V | 5.6V | 2.8V | 5.6V |
| 2 X WLDS: | 2.8V | 4.6V | 2.8V | 4.6V | 2.8V | 4.6V | 2.8V | 4.6V | 2.8V | 4.6V | 2.8V | 4.6V | 2.8V | 4.6V | 2.8V | 4.6V |
| WL 0: | 8.0V | 8.8V | 8.0V | 8.8V | 8.0V | 8.8V | 8.0V | 8.8V | 8.0V | 8.8V | 8.0V | 8.8V | 8.0V | 8.8V | 8.0V | 8.8V |
| WL 1→N−1 | 8.0V | 8.8V | 8.0V | 8.8V | 8.0V | 8.8V | 8.0V | 8.8V | 8.0V | 8.8V | 8.0V | 8.8V | 8.0V | 8.8V | 8.0V | 8.8V |
| WL N: | VPGM | 2.0V | VPGM | 2.0V | VPGM | 2.0V | VPGM | 2.0V | VPGM | 2.0V | VPGM | 2.0V | VPGM | 2.0V | VPGM | 2.0V |
| WL N+1→46 | 5.0V | 2.8V | 5.0V | 2.8V | 5.0V | 2.8V | 5.0V | 2.8V | 5.0V | 2.8V | 5.0V | 2.8V | 5.0V | 2.8V | 5.0V | 2.8V |
| WL 47: | 5.0V | 2.8V | 5.0V | 2.8V | 5.0V | 2.8V | 5.0V | 2.8V | 5.0V | 2.8V | 5.0V | 2.8V | 5.0V | 2.8V | 5.0V | 2.8V |
| 2 X WLDD: | 2.8V | 4.6V | 2.8V | 4.6V | 2.8V | 4.6V | 2.8V | 4.6V | 2.8V | 4.6V | 2.8V | 4.6V | 2.8V | 4.6V | 2.8V | 4.6V |
| 4 X SGD: | 2.8V | 5.6V | 2.8V | 5.6V | 2.8V | 5.6V | 2.8V | 5.6V | 2.8V | 5.6V | 2.8V | 5.6V | 2.8V | 5.6V | 2.8V | 5.6V |
| BL: | 2.8V | 2.8V | 1.6V | 2.1V | 0.8V | 1.3V | 0.0V | 0.5V | 2.8V | 2.8V | 2.8V | 2.8V | 2.8V | 2.8V | 2.8V | 2.8V |

THREE DIMENSIONAL NON-VOLATILE MEMORY WITH CURRENT SENSING PROGRAMMING STATUS

CLAIM OF PRIORITY

This application claims the benefit of U.S. Provisional Application 62/244,942, filed Oct. 22, 2015, incorporated herein by reference in its entirety.

BACKGROUND

Recently, ultra high density storage devices have been proposed using a three dimensional (3D) stacked memory structure sometimes referred to as a Bit Cost Scalable (BiCS) architecture. For example, a 3D NAND stacked memory device can be formed from an array of alternating conductive and dielectric layers. A memory hole is drilled in the layers to define many memory layers. A NAND string is then formed by filling the memory hole with appropriate materials. A straight NAND string (I-BiCS) extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers. However, various challenges are presented in operating such memory devices.

BRIEF DESCRIPTION OF THE DRAWINGS

Like-numbered elements refer to common components in the different figures.

FIG. 8 depicts a set of threshold voltage distributions representing data states.

FIGS. 9A-9E depict a programming process.

FIG. 11 is a table identifying various voltages applied to the individual source lines and bit lines.

FIG. 12 is a table identifying various voltages applied to word lines and select gate lines.

FIG. 13 depicts the voltage applied to the selected word line during a programming process.

FIG. 16 is a table of voltages used during one embodiment of programming and verification of programming.

FIG. 18 is a table of voltages used for a first pass of a multi-pass programming process that programs high states first.

FIG. 19 is a table of voltages used for a second pass of a multi-pass programming process that programs high states first.

DETAILED DESCRIPTION

Figure 1A:
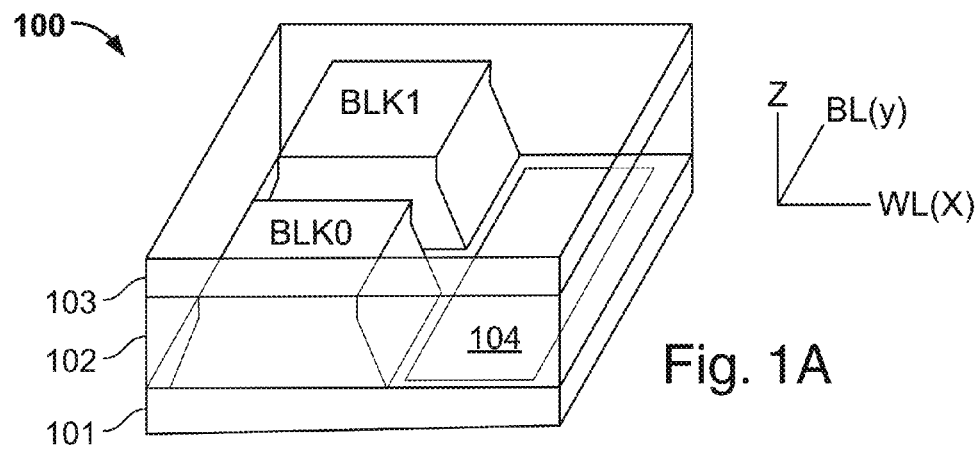
FIG. 1A is a perspective view of a portion of a 3D stacked non-volatile memory.

Typically, when a non-volatile semiconductor memory performs a programming process, a programming voltage is applied to the selected memory cells as set of programming pulses. Between programming pulses, typical memory systems verify whether each of the selected memory cells have reached their target data state (ie the target of the programming operation). Those memory cells that are verified to have reached their target data state are locked out from additional programming. Many non-volatile memory systems lock out memory cells from additional programming by raising an associated bit line to a lockout voltage. After verifying whether each of the selected memory cells have reached their target data state, and prior to the next programming pulse, typical memory systems will perform a scan operation that includes counting the number of memory cells that have been successfully programmed (e.g., have reached their target data state). When enough memory cells have been successfully programmed, the programming process is finished. While this scheme works well, the scan operation is time consuming and uses power.

To increase performance and save power, it is proposed to program non-volatile memory cells (including verifying the programming) without performing a scan operation. During the portion of the programming process when memory cells transition from being programmed to being locked out, the memory system can monitor Icc. For a memory system, Icc is the total current coming into the memory die from one or more off die supplies. As a memory cell transitions from being programmed to being locked out, its associated bit line will be moved to a higher voltage (ie the lockout voltage)

which draws more current. Therefore, monitoring current drawn by the memory die will be indicative of the number of memory cells transitioning from being programmed to being locked out. The memory system can keep track of the current monitored after several verify operations and feed these monitored current values into an algorithm for comparing the monitored current values to a reference. For example, the memory system can and feed these monitored current values into an algorithm for comparing the monitored current values to one or more reference sets of current values to determine whether the monitored current values indicate that enough memory cells have been successfully programmed so that the programming process is complete.

One embodiment of a suitable memory system includes a the three dimensional stacked non-volatile memory structure that comprises alternating dielectric layers and conductive layers in a stack, a plurality of bit lines below the stack, and a plurality of source lines above the stack. There is a separate source line associated with each bit line, rather than one source line for an entire block, plane or array. Each source line is connected to a different subset of NAND strings. Each bit line is connected to a different subset of NAND strings. Because the bit lines are below the stack, there is no need for signal lines to carry signals from the substrate surface to the top of the stack for the bit lines and no crowding of lines occurs as bit lines try to pass through source lines when they are both at minimum pitch. Since bit line driver circuits are bigger than source line driver circuits, one embodiment locates bit lines underneath the memory array so that the bit line drivers residing on the silicon surface under the memory array have direct access to the bit lines. In one embodiment, the source line drivers, being smaller in size, are placed on the side of the memory array. Since the source line drivers are smaller than the bit line drivers and also smaller than the traditional sense amp circuits, this arrangement shrinks the memory die size by saving the area which is traditionally reserved for sense amplifiers (the traditional bit line drivers).

The three dimensional stacked memory device comprises a plurality of memory cells arranged in blocks. Each block includes memory holes (or pillars) which extend vertically in the stack, and comprise a column of memory cells such as, for example, in a NAND string. The three dimensional stacked non-volatile memory device includes N layers. The memory holes are divided into four groups at each level of a block and each group has a separate set of source side and drain side select signals so that a subset of memory holes can be active at any given time. Because of the concurrency in the programming and verifying, the number of programming and verify pulses is reduced and the overall programming process is faster than other architectures. This is enabled because each memory channel/hole in a selected group has its own dedicated source line in addition to having its own dedicated bit line. With this architecture each memory channel can be driven to its own designated voltage at both its source line and its bit line. This provides full control of the channel potential. Each channel can have one of a number of different potentials applied to it based on what data state is to be programmed on the memory cell that is along that channel and belongs to the selected word line. A data state is a condition of the memory cell which correlates to storing a predefined pattern of data. The meaning of a data state can change based on the type of memory technology used in various embodiments. For example, in a multi-level memory cell different threshold voltage levels for the cell may correlate to a particular data pattern that represents data settings on two or more logical levels of data stored in the multi-level memory cell. In another example, the data state may comprise the level of resistance for a filament formed in the cell. In another example, the data state may comprise the magnetic orientation of a magnetic layer in a Spin-transfer torque random access memory cell (STT-RAM).

The proposed structure allows for multiple data states to be verified concurrently, as is explained below. Memory cells are concurrently programmed to different data states, with memory cells being programmed to lower data states having their programming slowed by applying appropriate source line voltages and bit line voltages. In one embodiment, reading is performed sequentially for the data states.

FIG. 1A is a perspective view of a portion of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more metal layers lower than the bit line layer which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. While two blocks are depicted in FIG. 1A as an example, additional blocks can be used, extending in the x- and/or y-directions.

In one possible approach, the length of the plane, in the x-direction, represents a direction in which word lines extend, and the width of the plane, in the y-direction, represents a direction in which bit lines extend. The z-direction represents a height of the memory device.

Figure 1C:
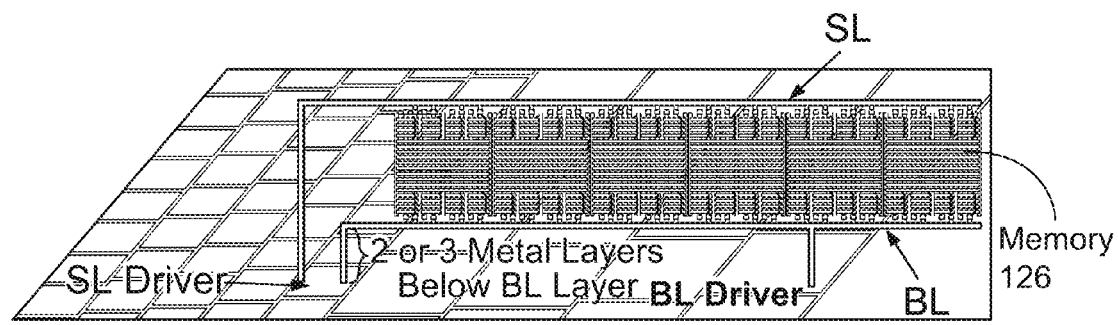
FIG. 1C and FIG. 1D show the positioning of the memory array, source line drivers and bit line drivers.
Figure 1D:
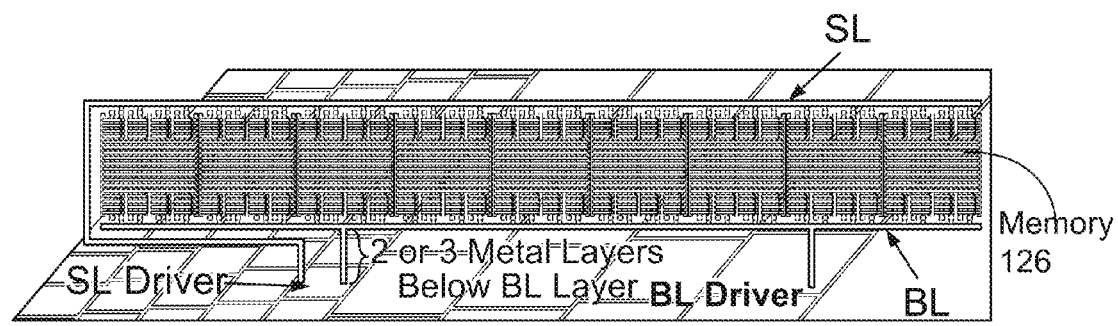
Figure 1B:
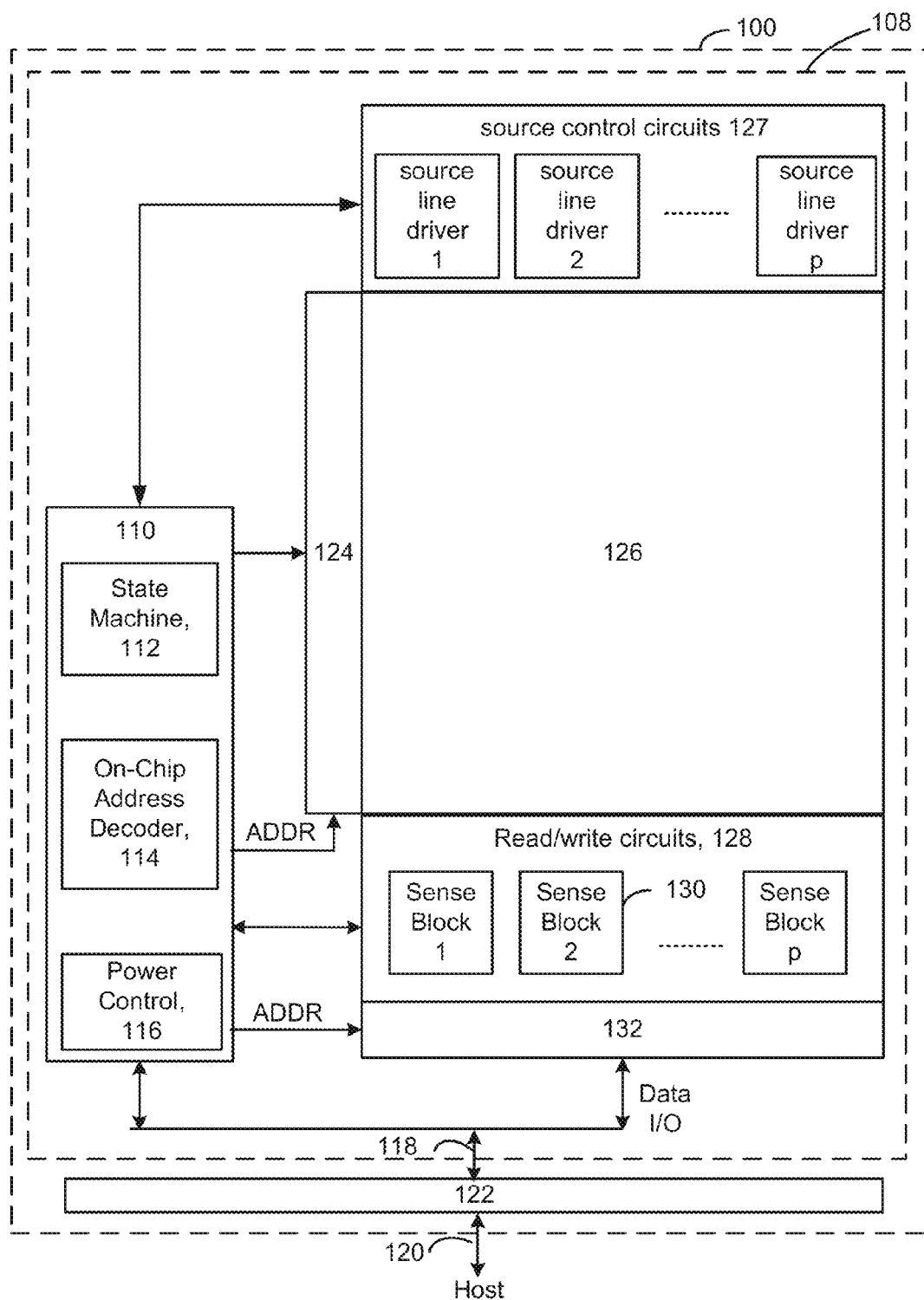
FIG. 1B is a functional block diagram of a memory system that includes the 3D stacked non-volatile memory of FIG. 1A.

FIG. 1B is a functional block diagram of the 3D stacked non-volatile memory device 100 of FIG. 1A. The memory device 100 may include one or more memory die 108. The memory die 108 includes a memory array (or other memory structure) 126 of memory cells. Memory array 126 is a monolithic three dimensional memory array in which multiple memory levels are formed above (and not in) a single substrate, such as a wafer, with no intervening substrates. Memory array 126 may comprise any type of nonvolatile memory that is monolithically formed in one or more physical levels of memory cells having active areas disposed above a silicone substrate. In one embodiment, memory array 126 implements NAND flash memory.

Memory array 126 is addressable by word lines via a row decoder 124 and by bit lines via a column decoder 132. The read/write circuits 128 include multiple sense blocks 130 (sensing circuitry) and allow a page (or other unit) of memory cells to be read or programmed in parallel. In some embodiments, a controller 122 is included in the same memory device 100 (e.g., a removable storage card) as the one or more memory die 108. In other embodiments, controller 122 is separated from the memory die 108. Commands and data are transferred between the host and controller 122 via lines 120 and between the controller and the one or more memory die 108 via lines 118.

The control circuitry 110 cooperates with the read/write circuits 128 to perform memory operations on the memory array 126, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, source side select lines (SGS) and drain side select lines (SGD) and source lines. The sense blocks 130 include bit line drivers and circuits for sensing. Control circuitry 110 is also in communication with source control circuits 127, which includes source line driver circuit 1, source line driver circuit 2, ... , source line driver circuit p. The source line driver circuits are used to drive different (or the same) voltages on the individual source lines. The present architecture provides individual control of one source line per active memory cell. Hundreds of thousands (for example about 300,000) of source line driver circuits are required in addition to the same number of bit line driver circuits.

In some implementations, some of the components can be combined. In various designs, one or more of the components (alone or in combination) of FIG. 1B, other than memory array 126, can be thought of as one or more control circuits. For example, one or more control circuits may include any one of, or a combination of, control circuitry 110, state machine 112, decoders 114/124/132, power control module 116, sense blocks 130, source control circuits 127, read/write circuits 128, and controller 122, and so forth. In one embodiment, the one or more control circuits are connected to the memory cells of memory array 126 and configured to perform programming (including verify) and reading of the memory cells.

FIG. 1C and FIG. 1D show the positioning of the memory array 126, source line drivers (SL Driver) and bit line drivers (BL Driver). FIG. 1C shows an embodiment where bit line drivers (BL Driver) are below the memory array 126 and source line drivers (SL Driver) are to the side of memory array 126. FIG. 1C also shows an example source line SL above memory array 126 and an example bit line BL below memory array 126. In one embodiment, the SL Driver includes a unity gain buffer for matching BL voltage during programming and a low Vth single transistor amp (source follower) for subtracting ~0.5V from VBL to apply to SL at other times. FIG. 1D shows the embodiment where bit line drivers (BL Driver) and source line drivers (SL Driver) are below memory array 126. One of the metal layers bellow the memory layer will be consumed. In one embodiment, there would be 3 available metal layers, for example, for connecting the bit line drivers, but only two layers available for connecting the source line drivers. It also means that the layer below the bit line layer becomes a critical layer at minimum pitch (in one example implementation). FIGS. 1 C/D show how bit lines and source lines can coexist without any difficulty encountered when one set try to pass through the other set. No such difficulty exists because one set does not need to try to pass through the other set. FIGS. 1C/D illustrate that both sets can be comfortably connected to their drivers without having to cross each other's metal layers. Any 3D memory architecture that has vertical channels as well as channels fabricated above metal layers (e.g. poly silicon channels as opposed to crystalline silicon channel) can benefit from the attributes of this architecture. Note that crystalline channels require crystalline seed layer of silicon from which the crystalline silicon channel can be grown by epitaxy.

Figure 1E:
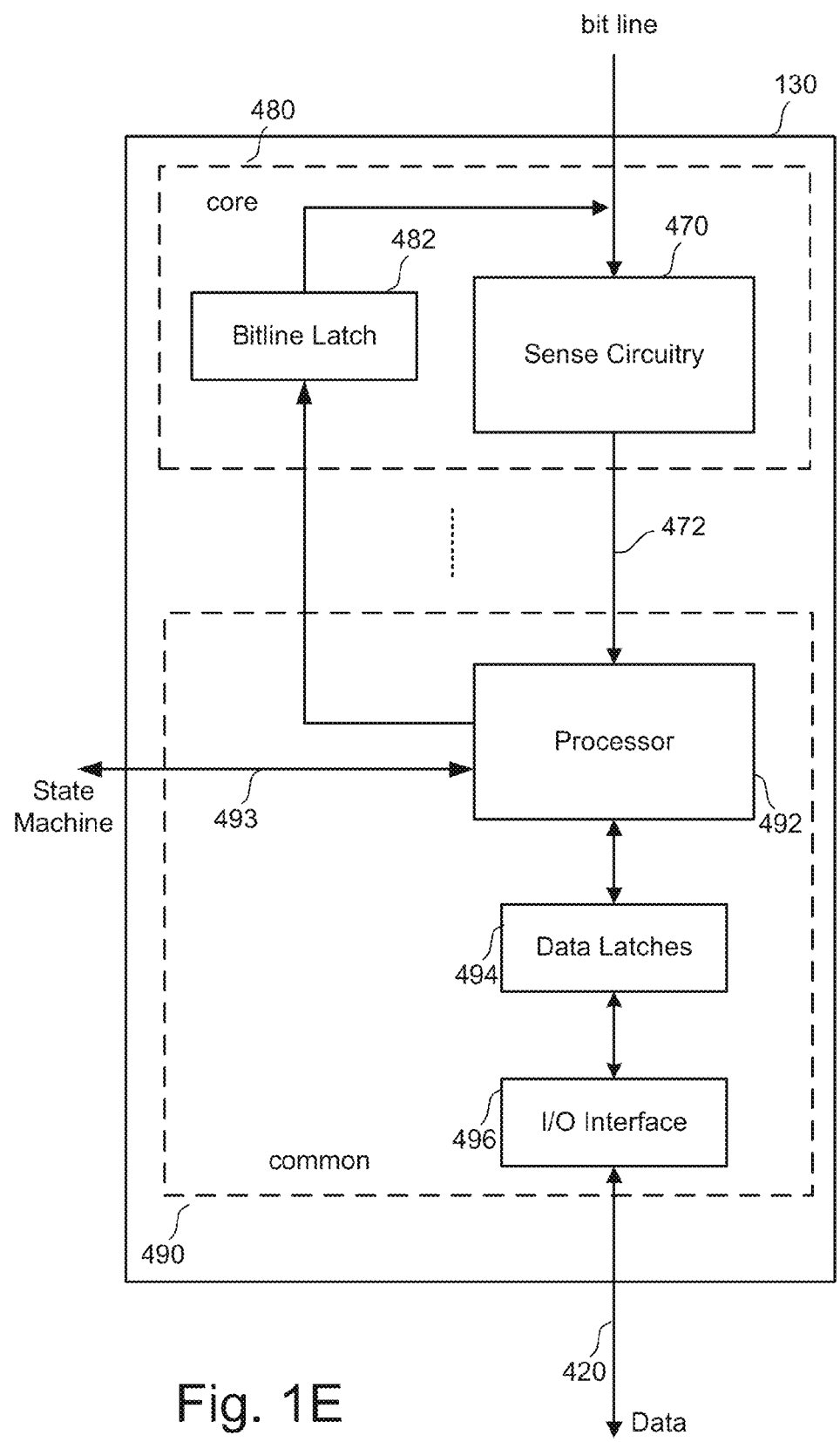
FIG. 1E is a block diagram of a sense block.

FIG. 1E is a block diagram of an individual sense block 130 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., 2*Vdd or just under 2*Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During sensing (i.e. read or verify), the operation of the system is under the control of state machine 112 that controls the supply of different control gate voltages to the addressed cell. As it steps through one or more predefined control gate voltages (the read reference voltages or the verify reference voltages) corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

During program or verify, the data to be programmed is stored in the set of data latches 494 from the data bus 420. The program operation, under the control of the state machine, comprises a series of programming voltage pulses (with increasing magnitudes) each of which is concurrently applied to the control gates of a set of addressed memory cells so that the memory cells are programmed at the same time. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a lockout voltage, which prevent additional programming. This inhibits the memory cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are three (or four or another number) data latches per sense module 480. In some implementations (but not required), the data latches are implemented as a shift register so that the parallel data stored therein is converted to serial data for data bus 420, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data into or out of the data bus in sequence as if they are part of a shift register for the entire read/write block.

During a memory operation (such as programming, verifying or reading), sense circuitry 470 is responsible for applying a bit voltage to the respective bit line. As discussed below, during programming and verification, the bit line voltages are data dependent based on the target data state that the relevant memory cell connected to the bit line is being programmed to. Processor 492 reads the data being programmed from data latches 494 and configures sense circuitry 470 to drive the appropriate data dependent voltage on the bit line based on the data read from the data latches 494.

Figure 2:
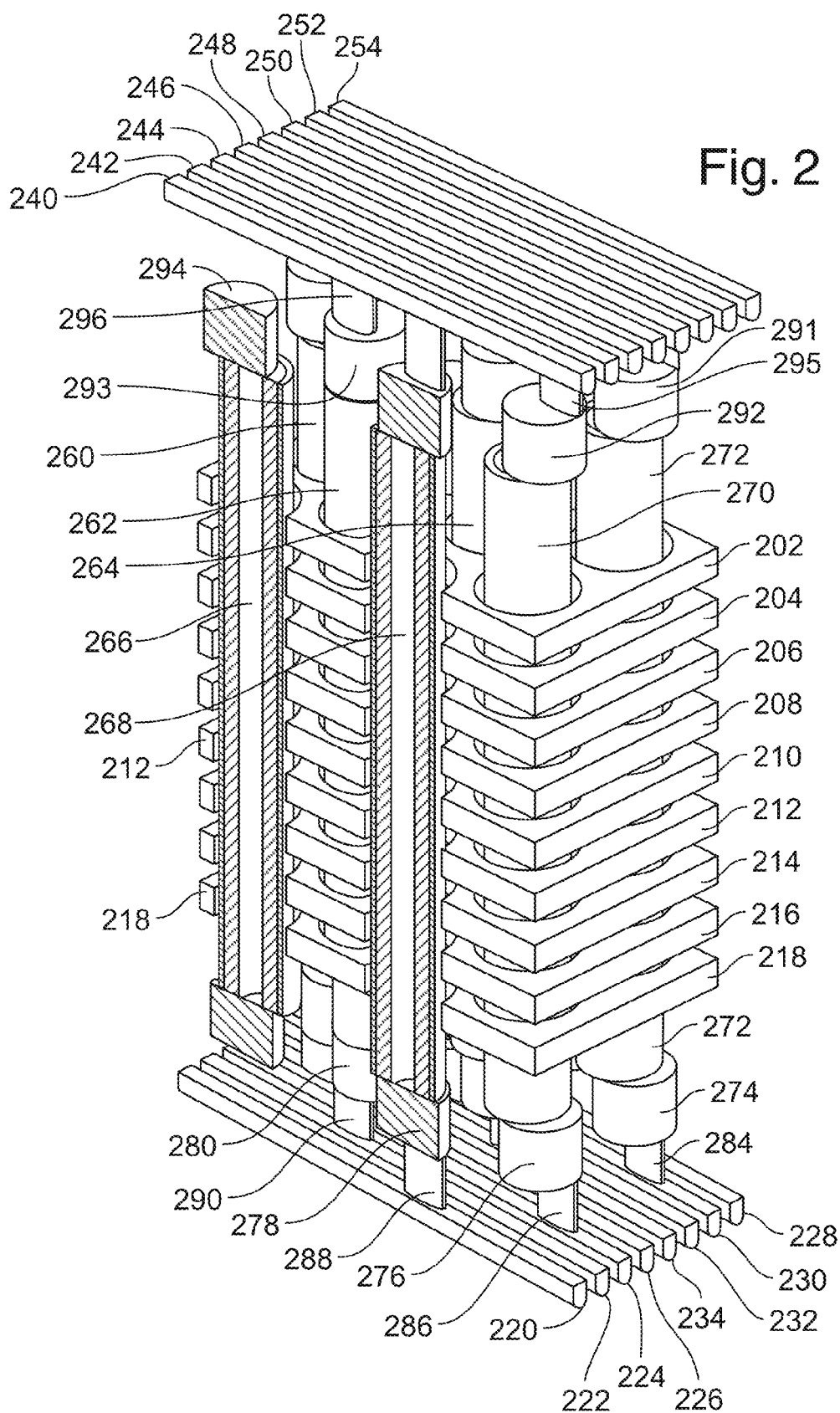
FIG. 2 is a perspective view of a portion of a 3D stacked non-volatile memory.

FIG. 2 is a perspective view of a portion of one embodiment of memory array 126 that is a three dimensional stacked non-volatile memory comprising alternating dielectric layers and conductive layers in a stack, a plurality of bit lines below the stack, and a plurality of source lines above the stack. For example, FIG. 2 shows conductive layers 202, 204, 206, 208, 210, 212, 214, 216, and 218, each of which operates as a word line and, therefore, can be referred to as a word line layer. To allow the drawing to fit on one page and be readable, not all of the conductive layers are depicted. For example, FIG. 2 does not show any of the conductive layers operating as source side select layers (SGSs) and drain side select layers (SGDs). One embodiment may include 60 conductive layers, with 48 conductive layers operating as word line layers, two layers above the 48 word line layers as dummy layers on the source side, four layers above dummy source layers operating as source side select layers (SGS), two layers below the 48 word line layers as dummy layers on the drain side, four layers below dummy drain layers operating as drain side select layers (SGDs). Other embodiments can implement different numbers of word line layers, dummy layers, source side select layers and drain side select layers.

Between the conductive layers are dielectric layers. Many different dielectric materials can be used. One example of a suitable dielectric material is SiO2. Note that FIG. 2 does not show the dielectric material between the conductive layers.

Below the stack of alternating dielectric layers and conductive layers are multiple separate and isolated bit lines 220, 222, 224, 226, 228, 230, 232, and 234. Although FIG. 2 only shows eight bit lines, the memory system is likely to have many more than eight bit lines (e.g. 300,000).

Above the stack of alternating dielectric layers and conductive layers are multiple separate and isolated source lines 240, 242, 244, 246, 248, 250, 252 and 254. Although FIG. 2 only shows eight source lines, the memory system is likely to have many more than eight source lines (e.g. 300,000). In one embodiment, bit line drivers (which include the sense amps) are located below the memory array (stack of layers) while the source line drivers are located to the side of the memory array. In another embodiment, both bit line drivers and source line drivers are located under the memory array. This provides further die size savings at the expense of consuming one of a number of available metal layers over the source line drivers and under the bit lines for connecting the source line drivers to the source lines. The number of available metal layers above the silicon surface and below the bit line layer in certain embodiments is either three or four. This does not include the contact and via layers. If we also count these contact and via layers, the number of metal layers below memory array (including the bit line layer plus its via layer below it, and its via layer above it) add up to nine layers in one embodiment or to eleven layers in another embodiment. Contact and via layers typically provide vertical connectivity in Z direction, whereas the other metal layers provide both vertical and horizontal connectivity within the plane of the chip.

The stack of alternating dielectric layers and conductive layers includes memory holes or pillars which extend vertically in the stack, and comprise a column of memory cells such as in a NAND string. FIG. 2 shows columns/holes/pillars 260, 262, 264, 266, 268, 270, and 272. Although FIG. 2 only shows seven columns, the memory system is likely to have many more than seven columns. As depicted, each conductive layer will surround a set of columns, with one memory cell residing at the intersection of each column and each of the conductive layers designated to be function as word lines.

Each bit line is connected to a subset of columns. For example, FIG. 2 shows bit line 230 connected to column 272, bit line 224 connected to column 270, bit line 220 connected to column 268 (note that column 268 is only partially depicted), and bit line 222 connected to column 262. Note that the terms "connected," "coupled" and "in communication with" include direct connections and connections via other components. The bit lines connect to the columns through a combination of vias and plugs. For example, bit line 230 is connected to column 272 by via 284 and plug 274, bit line 224 is connected to column 270 by via 286 and plug 276, bit line 220 is connected to column 268 by via 288 and plug 278, and bit line 222 is connected to column 262 by via 290 and plug 280.

Each source line is connected to a subset of columns In one embodiment, the source lines connect to the columns through vias and plugs. FIG. 2 shows plugs 291, 292, 293 and 294, as well as vias 295 and 296. Many of the via for the source lines are hidden due to the perspective view. However, FIG. 2 does show column 270 connected to source line 244 by via 295 and plug 292.

The source lines are not connected together and can carry different signals. In one embodiment, each source line is associated with a bit line to create a source line/bit line pair. The system includes many source line/bit line pairs. Each bit line is associated with a different and separate source line. A source line is connected to the same column as its associated bit line of the source line/bit line pairs. For example, bit line 230 is associated with source line 252 and both are connected to column 272, bit line 224 is associated with source line 244 and both are connected to column 270, bit line 220 is associated with source line 240 and both are connected to column 268, and bit line 222 is associated with source line 242 and both are connected to column 262. In one embodiment, the bit lines are made of Tungsten, the source lines are made of Copper or Tungsten, the vias are made of Tungsten and the plugs are made of polysilicon. In one embodiment, the conductive word line layers are made of Tungsten. Tungsten may be preferable as it can withstand the process thermal budget associated with processing the layers above it, and the required dopant activation or polysilicon channel grain size expansion anneal steps that follow the deposition of the Tungsten.

Figure 3:
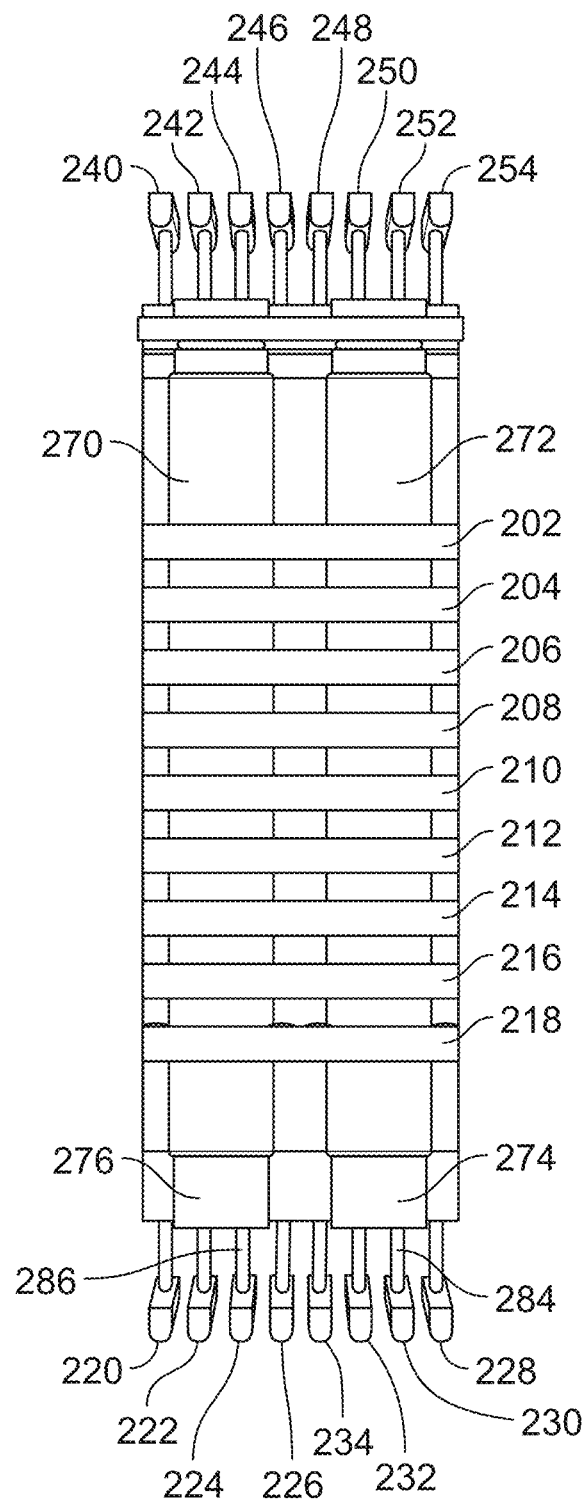
FIG. 3 is a side view of a portion of a 3D stacked non-volatile memory.

FIG. 3 is a side view of the structure depicted in FIG. 2. Like FIG. 2, although FIG. 3 shows conductive layers 202, 204, 206, 208, 210, 212, 214, 216, and 218, FIG. 3 does not explicitly depict the dielectric layers between the conductive layers. Furthermore, FIG. 3 (like FIG. 2) only shows a subset of the conductive layers.

Figure 4:
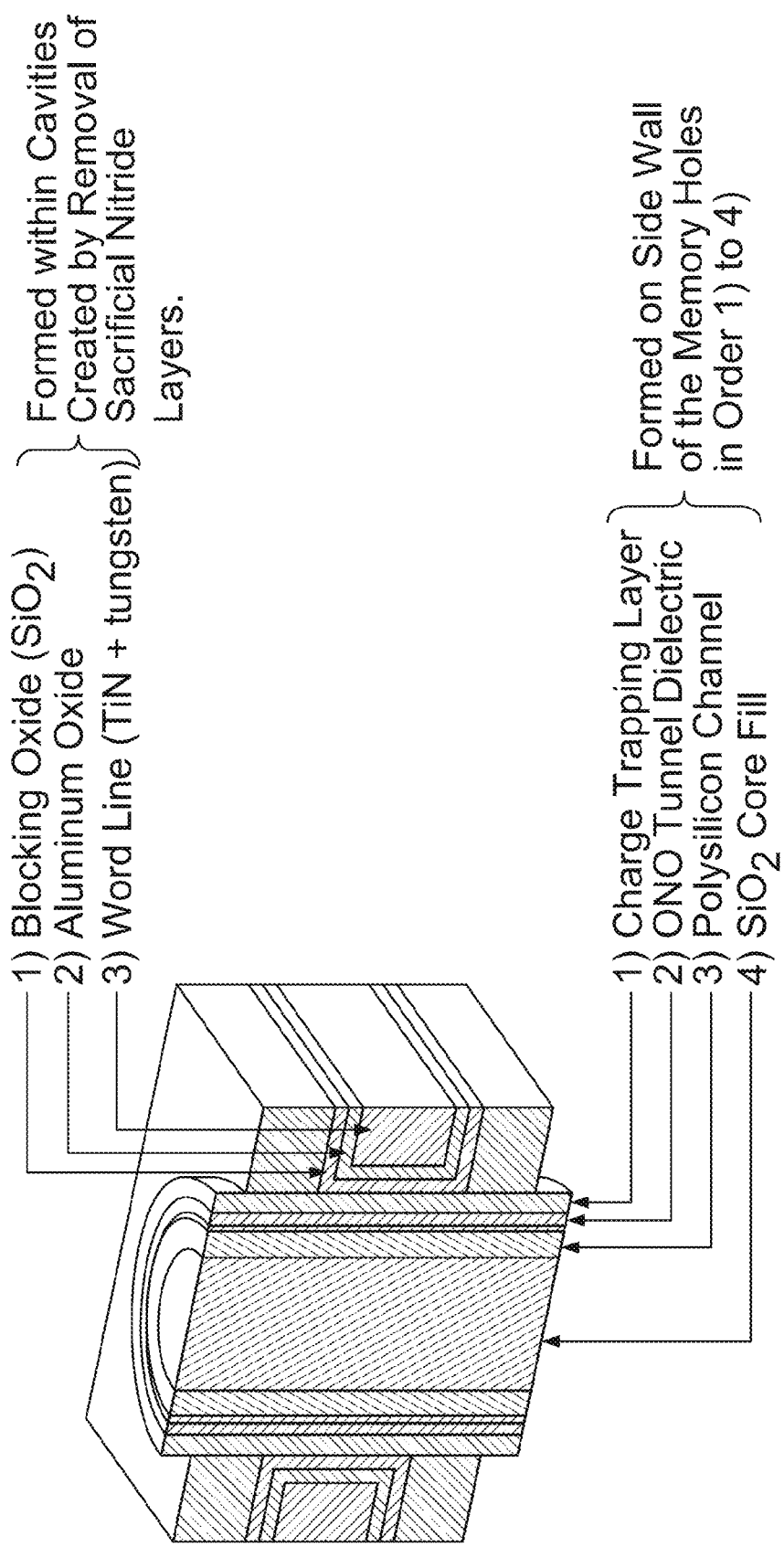
FIG. 4 is a cross sectional and perspective view of a column of the 3D stacked non-volatile memory.

FIG. 4 is a perspective view of a cross section of a column from the memory array 126 (stack) described above. Each column includes a number of layers which are deposited along the sidewalls of the column. These layers formed on the sidewall of the memory holes can include, from the outer perimeter of the hole moving radially in toward the center, a charge trapping layer such as a specially formulated silicon nitride that increases trap density, followed by oxide-nitride-oxide (O—N—O) stack layer that acts as a band gap engineered tunnel dielectric, followed by polysilicon layer (s), followed by the inner most dielectric such as silicon oxide core fill. These layers are deposited using methods such as atomic layer deposition, chemical vapor deposition, or physical vapor deposition. There are many other intermediary steps such as anneals, densifications and sacrificial layers that are temporarily deposited and later removed. The inner most oxide of the ONO tunnel dielectric that is in contact with the polysilicon channel can be created by converting some thickness of the deposited nitride layer to oxide by methods such as ISSG (In-Situ Steam Generation). Other layers of the memory cell structure can be formed by depositions into the horizontal voids left behind after the sacrificial nitride layers are etched out, as opposed to deposition in the memory hole. Such layers can include the silicon oxide blocking layer and the aluminum oxide high K transition layer between the silicon oxide blocking layer and the word line. The word line deposition can start with a titanium nitride layer deposited on aluminum oxide followed by a tungsten seed layer deposition and then the remainder of the cavities for word line fingers can be filled with tungsten. Inside the cavities between word line layers, for example, a blocking oxide (SiO2) can be deposited. The Blocking Oxide surrounds the charge trapping layer. Surrounding the Blocking Oxide, and between the Blocking Oxide and the Word Line (TiN+Tungsten) is an Aluminum Oxide layer. In other embodiments, not shown in FIG. 2, the blocking oxide can be the first layer formed in the memory hole as opposed to the first layer formed in the cavities left behind after the sacrificial nitride layers are removed. The polysilicon channel is connected to a bit line at the bottom of the column and connected to the associated source line at the top of the column through intermediary deposited patterned layers including a metal via and a doped polysilicon plug, as discussed above. The polysilicon plugs can be n-type, preferably doped with some combination of Arsenic or phosphorus, or they can be p-type preferably doped with some combination of Boron or indium. In some embodiments Arsenic and indium are preferable because they diffuse more slowly during high temperature anneals which are required for poly crystalline grain size changes and other purposes.

When a memory cell is programmed, electrons are stored in a portion of the charge trapping layer which is associated with the memory cell. These electrons are drawn into the charge trapping layer from the polysilicon channel, and through the ONO tunnel dielectric. The threshold voltage (Vth) of a memory cell is increased in proportion to the amount of stored charge.

Each of the memory holes is thus filled with a plurality of annular layers comprising sometimes a blocking layer, usually a charge trapping layer, a usually tunnel dielectric multi-layers structure and a channel layer. A core region of each of the memory holes is filled with a body material, and the plurality of annular layers are between the core region and the WL that surround each of the memory holes.

Figure 5:
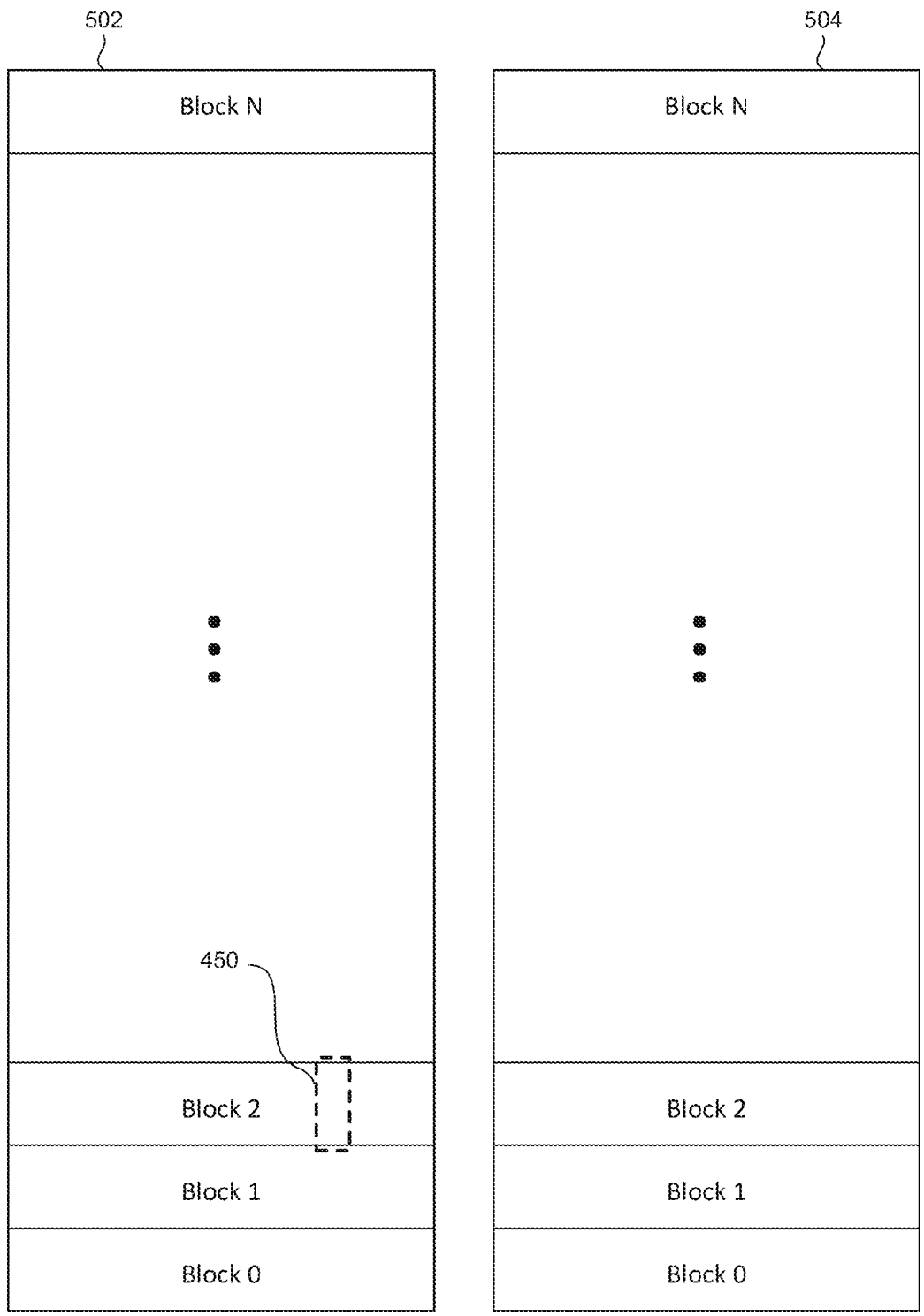
FIG. 5 is a block diagram of a 3D memory array.

Looking back at FIG. 2, memory system 100 includes a memory array 126 having the structure depicted in FIGS. 2, 3, and 4. FIG. 5 is a block diagram explaining the organization of memory array 126, which is divided into two planes 502 and 504. Each plane is then divided into N blocks. In one example, each plane has approximately 2000 blocks. However, different numbers of blocks and planes can also be used.

Figure 6:
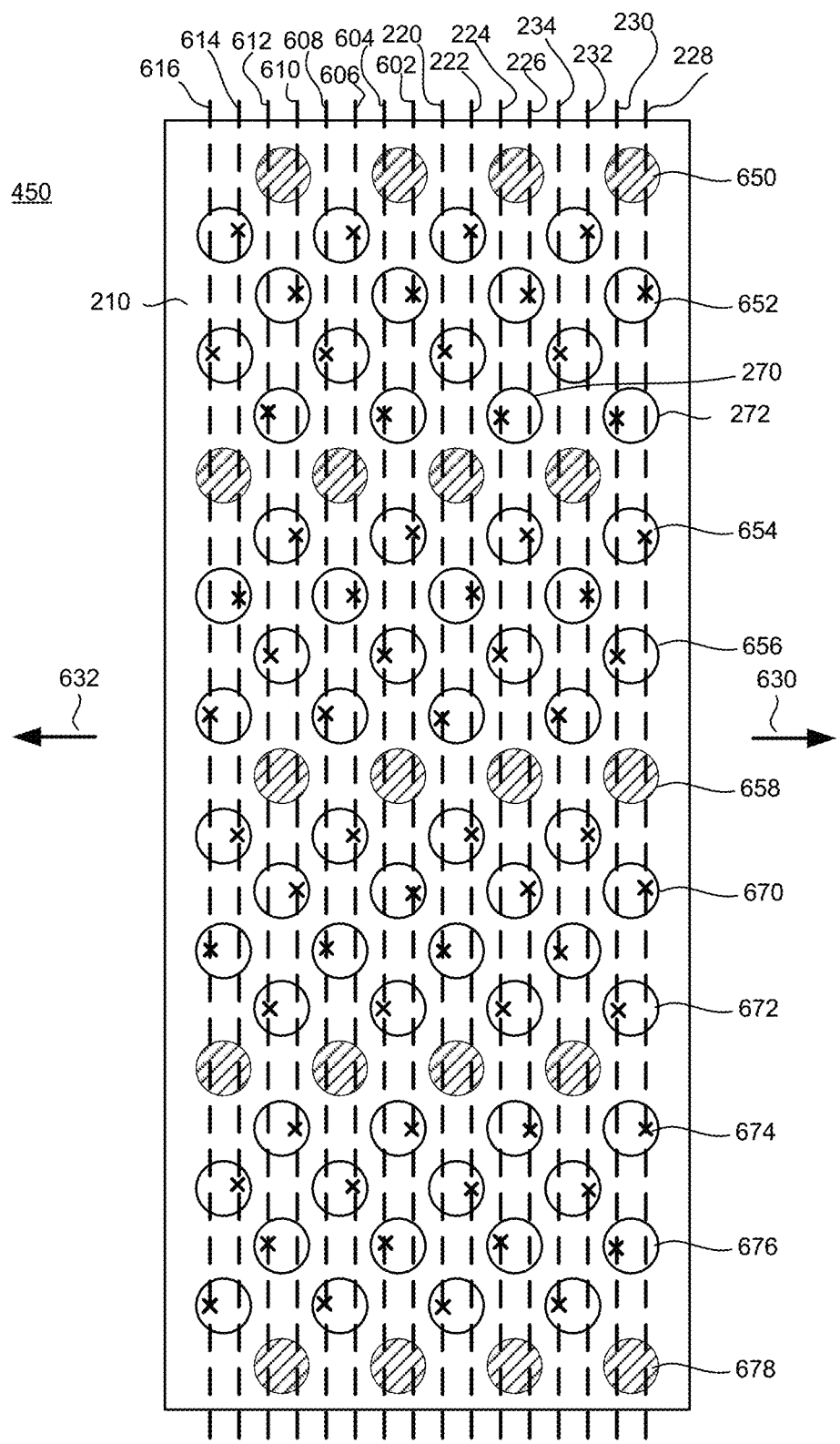
FIG. 6 is a top view of one layer of the 3D stacked non-volatile memory.

FIG. 6 is a block diagram depicting a portion of a top view of one layer of one block. The portion of the block depicted in FIG. 6 corresponds to box 450 in block 2 of FIG. 5. As can be seen from FIG. 5, the block depicted in FIG. 6 extends in the direction of arrow 632 and in the direction of arrow 630. In one embodiment, the memory array will have 48 memory layers; therefore, each block will have 48 layers. However, FIG. 6 only shows one layer. Each layer of a block has only one word line. For example, the layer of block 2 depicted in FIG. 6 includes word line 210 (see FIG. 2) surrounding a plurality of circles. Each circle represents a column (see FIG. 4). FIG. 6 has reference numbers for columns 270 (see FIG. 2), 272 (see FIG. 2), 650, 652, 654, 656, 658, 670, 672, 674, 676 and 678. Not all columns are provided with reference numbers in order to keep FIG. 6 readable. Some of the circles are shaded to indicate that those columns will not be used to store data, and are sacrificed to provide spacing.

FIG. 6 also shows dashed vertical lines. These are the bit lines. FIG. 6 shows sixteen bit lines: 220, 222, 224, 226, 228, 230, 232, 234, 604, 606, 608, 610, 612, 614 and 616. The lines are dashed to indicate that the bit lines are not part of this layer, rather they are below the stack. Each of the non-shaded circles has an "x" to indicate its connection to a bit line.

FIG. 6 does not show the source lines in order to keep the drawing readable. However, the source lines would be in the same position as the bit lines, but located above the stack rather than below. The source lines would connect to the columns in the same manner as the bit lines. Therefore, a source line and its associated bit line of a source line/bit line pair connect to the same column In this manner, the structure of the source lines is symmetrical to the structure of the bit lines. Thus, for every active column, there is a dedicated bit line and source line. If multiple columns are active at the same time, then each of the active columns has a unique dedicated bit line and a unique dedicated source line.

As can be seen from FIG. 6, each block has sixteen rows of active columns and each bit line connects to four columns in each block. For example, bit line 228 is connected to columns 652, 654, 670 and 674. Since all of these columns 652, 654, 670 and 674 are connected to the same word line 210, the system uses the source side select lines and the drain side select lines to choose one (or another subset) of the four to be subjected to a memory operation (program, verify, read, and/or erase).

Figure 7:
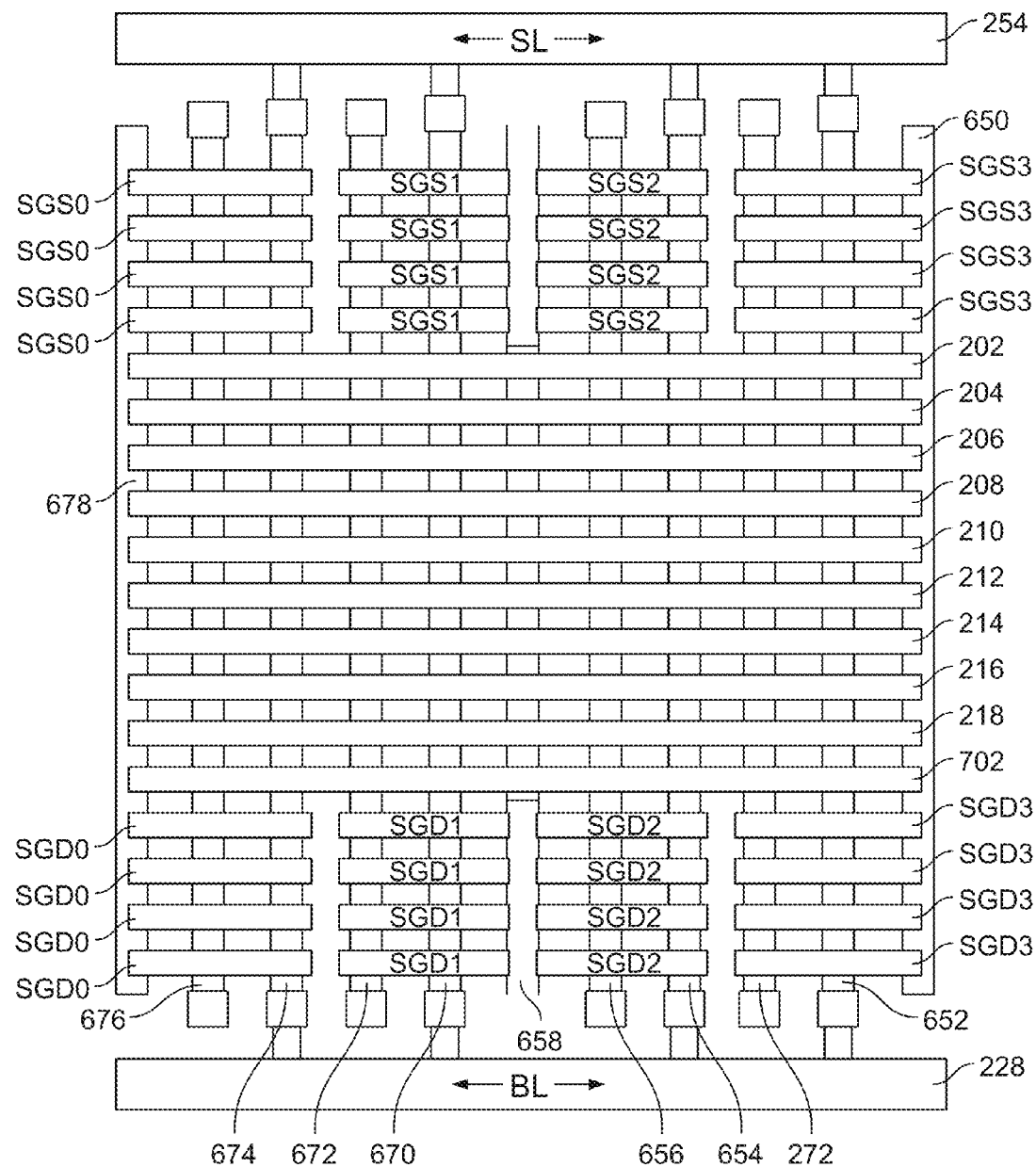
FIG. 7 is a side view of a portion of a 3D stacked non-volatile memory.

FIG. 7 is a side cutaway view of a portion of the memory array, along bit line 228 and source line 254. Note that bit line 228 is the associated bit line for source line 254, therefore, forming a source line/bit line pair. FIG. 7 shows that while the word line layers extend across the entire block, the source side select lines and the drain side select lines are broken up into four sections. In one embodiment, each source side select line is implemented as four vertical layers connected together. Within each block, there are source side select lines: SGS0, SGS1, SGS2 and SGS3. Similarly, the drain side select lines are implemented as four vertical layers connected together. Within each block, there are four drain side select lines: SGD0, SGD1, SGD2 and SGD3. In one embodiment, SGS0 and SGD0 are used to control columns 674 and 676, SGS1 and SGD1 are used to control columns 672 and 670, SGS2 and SGD2 are used to control columns 654 and 656, and SGS3 and SGD3 are used to control columns 272 and 652.

FIG. 8 illustrates example threshold voltage distributions for the memory cell array when each memory cell stores three bits of data. Other embodiments, however, may use more or less than three bits of data per memory cell (e.g., such as two bits of data per memory cell, or four bits of data per memory cell). In the example of FIG. 8, there are eight valid threshold voltage distributions, also called data states (or target states): S0, S1, S2, S3, S4, S5, S6 and S7. In one embodiment, data state S0 is below 0 volts and data states S1-S7 are above 0 volts. In other embodiments, all eight data states are above 0 volts, or other arrangements can be implemented. In one embodiment, the threshold voltage distribution for S0 is wider than for S1-S7. In one embodiment, S0 is for erased memory cells. Data is programmed from S0 to S1-S7.

Each data state corresponds to a unique value for the three data bits stored in the memory cell. In one embodiment, S0=111, S1=110, S2=101, S3=100, S4=011, S5=010, S6=001 and S7=000. Other mapping of data to states S0-S7 can also be used. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, describe various data encoding schemes for multi-state flash memory cells. In one embodiment, data values are assigned to the threshold voltage ranges using a Gray code assignment so that if the threshold voltage of a floating gate erroneously shifts to its neighboring threshold voltage distribution, only one bit will be affected. However, in other embodiments, Gray code is not used.

In one embodiment, all of the bits of data stored in a memory cell are stored in the same logical page. In other embodiments, each bit of data stored in a memory cell corresponds to different logical pages. Thus, a memory cell storing three bits of data would include data in a first page, data in a second page and data in a third page. In some embodiments, all of the memory cells connected to the same word line would store data in the same three pages of data. In some embodiments, the memory cells connected to a word line can be grouped into different sets of pages (e.g., by odd and even bit lines, or by other arrangements).

In some devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 8. In other embodiments, memory cells can be programmed using a coarse/fine methodology or other scheme.

FIG. 8 shows a set of verify target levels Vv1, Vv2, Vv3, Vv4, Vv5, Vv6, and Vv7. These verify levels are used as comparison levels (also known as target levels and/or compare levels) during the programming process. For example, when programming memory cells to state S1, the system will check to see if the threshold voltages of the memory cells have reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Verify target level Vv2 is used for memory cells being programmed to state S2. Verify target level Vv3 is used for memory cells being programmed to state S3. Verify target level Vv4 is used for memory cells being programmed to state S4. Verify target level Vv5 is used for memory cells being programmed to state S5. Verify target level Vv6 is used for memory cells being programmed to state S6. Verify target level Vv7 is used for memory cells being programmed to state S7.

FIG. 8 also shows a set of read compare levels Vr1, Vr2, Vr3, Vr4, Vr5, Vr6, and Vr7. These read compare levels are used as comparison levels during the read process. By testing whether the memory cells turn on or remain off in response to the read compare levels Vr1, Vr2, Vr3, Vr4, Vr5, Vr6, and Vr7 being separately applied to the control gates of the memory cells, the system can determine for which states that memory cells are storing data. In one embodiment, Vr1=0.2 v, Vr2=1.0 v, Vr3=1.8 v, Vr4=2.6 v, Vr5=3.4 v, Vr6=4.2 v and Vr7=5.0 v. However, other values can also be used.

In general, during verify operations and read operations, the selected word line is connected to a voltage, a level of which is specified for each read operation (e.g., see read compare levels Vr1, Vr2, Vr3, Vr4, Vr5, Vr6, and Vr7, of FIG. 8) or verify operation (e.g. one voltage is used to verify all states, as discussed below) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells on selected columns (i.e. NAND chains) corresponding to a selected word line (i.e. finger) are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier while maintaining a specified bit line voltage. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, the program voltage applied to the control gate includes a series of pulses that are increased in magnitude with each successive pulse by a predetermined step size (e.g. 0.2 v, 0.3 v, 0.4 v, 0.6 v, or others). Between pulses, some memory systems will verify whether the individual memory cells have reached their respective target threshold voltage ranges.

FIGS. 9A-9E depict one example programming process that uses a predefined/fixed number of program pulses. In the embodiment depicted in FIGS. 9A-9E, six Vpgm program pulses are applied on the selected word line to achieve threshold voltage distributions as per FIG. 8. Initially, in one embodiment, all memory cells being programmed are erased to data state S0. After erasing, a first Vpgm program pulse is applied. In one embodiment, the first Vpgm program pulse is at 19 v; however, other voltages can be used. All memory cells being programmed will receive that same Vpgm program pulse. However, data dependent voltages are individually applied to the different bit lines and the different source lines so that memory cells being programmed to higher data states (e.g., S7) will increase in threshold voltage more quickly and memory cells being programmed to lower data states (e.g., S1) will increase in threshold voltage slower. The voltages applied to the bit lines and source lines are based on the target data state. Therefore, all memory cells being programmed to S1 will be subjected to a first bit line voltage and a first source line voltage, all memory cells being programmed to S2 will be subjected to a second bit line voltage and a second source line voltage, all memory cells being programmed to S3 will be subjected to a third bit line voltage and a third source line voltage, all memory cells being programmed to S4 will be subjected to a fourth bit line voltage and a fourth source line voltage, all memory cells being programmed to S5 will be subjected to a fifth bit line voltage and a fifth source line voltage, all memory cells being programmed to S6 will be subjected to a six bit line voltage and a six source line voltage, and all memory cells being programmed to S7 will be subjected to a seventh bit line voltage and a seventh source line voltage.

FIG. 9A depicts the results of applying the first Vpgm program pulse. FIG. 9A shows the target data states in solid lines and shows the actual threshold voltage distributions in dashed lines 802, 804, 806, 808, 810, 812 and 814. Actual threshold voltage distribution 802 represent the threshold voltage distribution for memory cells being programmed to data state S1. Actual threshold voltage distribution 804 represent the threshold voltage distribution for memory cells being programmed to data state S2. Actual threshold voltage distribution 806 represent the threshold voltage distribution for memory cells being programmed to data state S3. Actual threshold voltage distribution 808 represent the threshold voltage distribution for memory cells being programmed to data state S4. Actual threshold voltage distribution 810 represent the threshold voltage distribution for memory cells being programmed to data state S5. Actual threshold voltage distribution 812 represent the threshold voltage distribution for memory cells being programmed to data state S6. Actual threshold voltage distribution 814 represent the threshold voltage distribution for memory cells being programmed to data state S7. Note that the height/magnitude of the actual threshold voltage distributions 802, 804, 806, 808, 810, 812 and 814 is somewhat exaggerated in Figures A-E in order to make the drawings easier to read.

FIG. 9B depicts the results of applying the second Vpgm program pulse. As depicted, actual threshold voltage distributions 802, 804, 806, 808, 810, 812 and 814 have moved toward higher voltages. The second Vpgm pulse is applied to all of the memory cells being programmed. The system is not programming in six iterations to successively move memory cells from lower states to successively higher states, as the initial Vpgm program pulse already moved memory cells to each of the distributions (802-814). Certain memory cells will be in the target data state after the first Vpgm program pulse. The system is using multiple programming iterations to tighten up the threshold voltage distributions for each data state, not to progressively move higher data state memory cells to those higher data states.

FIG. 9C depicts the results of applying the third Vpgm program pulse. As depicted, actual threshold voltage distributions 802, 804, 806, 808, 810, 812 and 814 have moved toward higher voltages.

FIG. 9D depicts the results of applying the fourth Vpgm program pulse. As depicted, actual threshold voltage distributions 802, 804, 806, 808, 810, 812 and 814 have moved toward higher voltages.

FIG. 9E depicts the results of applying the fifth Vpgm program pulse. As depicted, actual threshold voltage distributions 802, 804, 806, 808, 810, 812 and 814 have moved toward higher voltages. After the sixth Vpgm program pulse, the actual threshold voltage distributions should be the same (or close) to the threshold voltage distributions depicted in FIG. 8.

Figure 10:
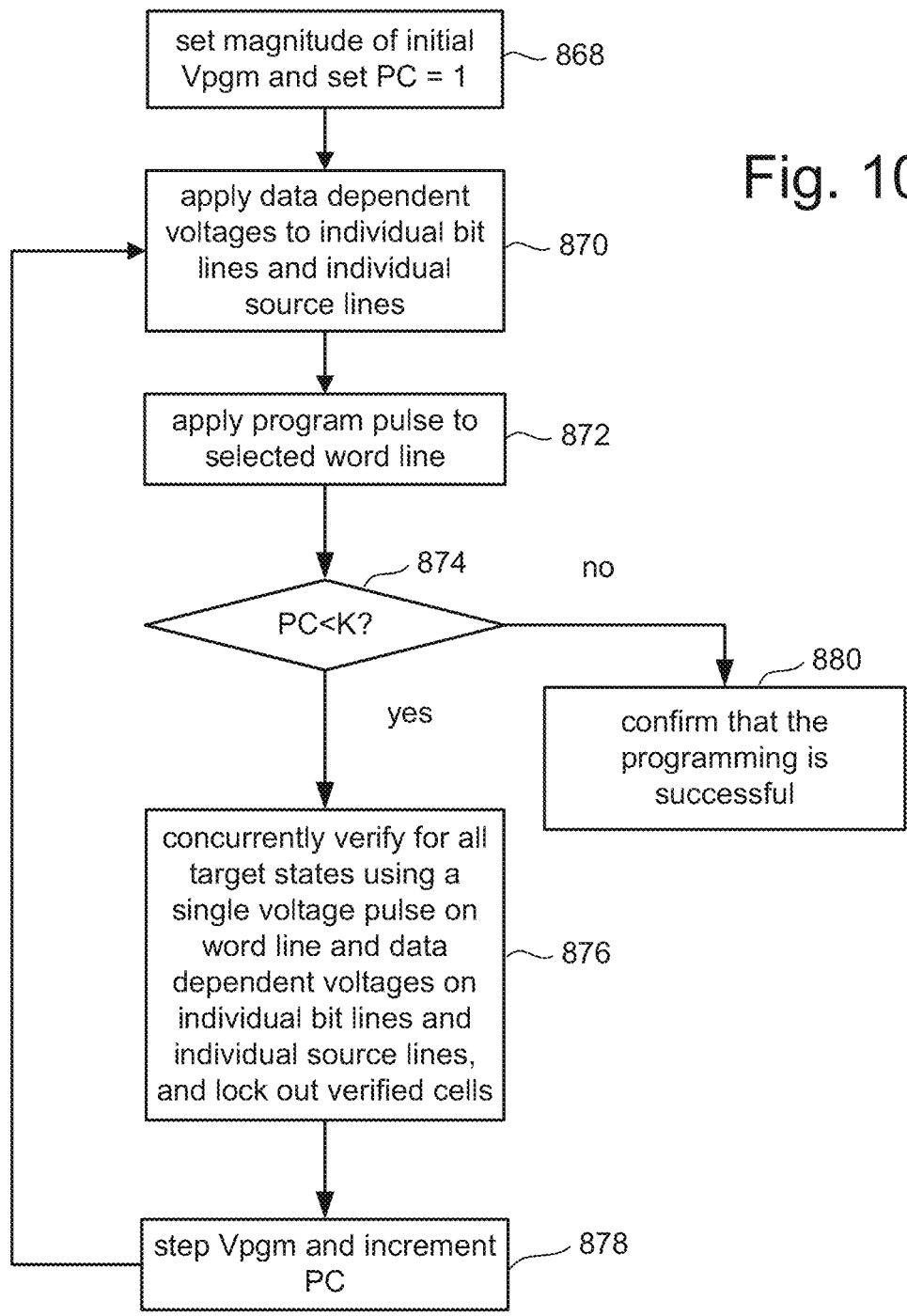
FIG. 10 is a flow chart describing one embodiment of a process for programming.

FIG. 10 is a flow chart describing one embodiment of a process for performing programming on memory cells connected to a common word line to one or more targets (e.g., data states or threshold voltage ranges). The process of FIG. 10 is one example of how to implement the behavior depicted in FIG. 9. The process of FIG. 10 can also be used to implement programming strategies different than that of FIG. 9.

Typically, the program voltage applied to the control gate during a program operation is applied as a series of program pulses. Between programming pulses the system will perform verification. In many implementations, the magnitude of the program pulses is increased with each successive pulse by a predetermined step size. In step 868 of FIG. 10, the programming voltage (Vpgm) is initialized to the starting magnitude (e.g., ~19V or another suitable level) and a program counter PC maintained by state machine 112 is initialized at 1. In step 870, data dependent voltages are individually applied to the different bit lines and the different source lines. Data dependent voltages are voltages that vary based on the data pattern being programmed. More details of step 870 are discussed below with respect to FIG. 11. In step 872, a program pulse of the program signal Vpgm is applied to the selected word line (the word line selected for programming). In one embodiment, the group of memory cells being programmed concurrently are all connected to the same word line (the selected word line). In step 872, the program pulse is concurrently applied to all memory cells connected to the selected word line.

In step 874, it is determined whether the program counter PC is less than K. In one embodiment, K=6, which means that the programming process will apply six programming pulses. The number 6 is based on the assumption that the natural VT distribution is about 3V wide and that the average VT shift up per program pulse is 0.5V. then 3.0/0.5=6 pulses. If the step size is changed or the assumption about the width of the natural distribution is wrong, then more or less pulses are needed. The technology described herein can be used with K>6 and K<6. The natural distribution is the response (i.e. new VT distribution) of a group of cells to a single program pulse when the same program pulse (or the same sequence of program pulses) is (are) applied to all of cells. The group of cells can be composed of, for example, all cells to be programmed on a word line, all cells to be programmed to a particular state on a word line, all cells on a block, all cells on a chip, all cells across many chips depending on the context in which the term natural VT distribution is used. Generally the larger the group of cells under consideration, the wider the natural distribution from end to end. FIG. 9A shows seven different natural distributions (one per program state) where each one is the outcome for cells to be programmed to a particular state, and these outcomes are different due to the fact that lower states' programming is retarded by virtue of applied higher voltages to the cell's source line and bit line. The lower the state, the higher the retarding potential transferred to its channel by application of these higher voltages to bit lines and source lines.

If the program counter PC is less than K, then the process continues at step 876, during which all of the memory cells being programmed are concurrently verified for all target data states using a single read voltage pulse on the selected word line and data dependent voltages on individual bit lines and individual source lines. Memory cells that verify successfully will be locked out from further programming for the remainder of the programming process. In step 878, the Program Counter PC is incremented by 1 and the program voltage Vpgm is stepped up to the next magnitude. After step 878, the process loops back to step 870 and another program pulse is applied to the selected word line. In one embodiment, the six program pulses are at 19 v, 19.6 v, 20.2 v, 20.8 v, 21.4 v and 22 v.

If, in step 874, it is determined that the program counter is not less than K (i.e. PC=K) then programming should be complete and in step 880 the system confirms that the programming was successful.

In one embodiment, there is no verification performed for the last program pulse. In other embodiments, verification can be performed for the last program pulse.

Steps 870-878 implement a loop of applying programming and then verifying (except for the last program pulse, which has no verify). This process is performed in an iterative fashion to avoid over programming. Thus, each iteration of steps 870-878 is referred to as a programming iteration.

FIG. 11 is a table that identifies one embodiment of data dependent source line voltages and bit line voltages for programming, verifying and reading. Step 870 of FIG. 10 includes applying data dependent voltages to individual source lines and bit lines for programming. The second column of FIG. 11 (header of "Program") identifies the data dependent voltages applied to individual source lines and the seventh column of FIG. 11 (header of "Program") identifies the data dependent voltages applied to individual bit lines. For example, if a memory cell is being programmed to state S1, then in step 870 the source line receives 4.8 volts and the bit line receives 4.8 volts. If a memory cell is being programmed to state S2, then in step 870 the source line receives 4.0 volts and the bit line receives 4.0 volts. If a memory cell is being programmed to state S3, then in step 870 the source line receives 3.2 volts and the bit line receives 3.2 volts. If a memory cell is being programmed to state S4, then in step 870 the source line receives 2.4 volts and the bit line receives 2.4 volts. If a memory cell is being programmed to state S5, then in step 870 the source line receives 1.6 volts and the bit line receives 1.6 volts. If a memory cell is being programmed to state S6, then in step 870 the source line receives 0.8 volts and the bit line receives 0.8 volts. If a memory cell is being programmed to state S7, then in step 870 the source line receives 0.0 volts and the bit line receives 0.0 volts. If the memory cell is to remain in the erased state S0, then in step 870 the source line receives 6.0 volts and the bit line receives 6.0 volts. Once a decision has been made based on one of the verify operations to lock out any particular cell from further programming (due to cell's VT exceeding its verify level), then from that point on the cell/column will be treated the same way as an erased cell (i.e. it will be locked out of further programming by boosting or other methods that inhibit programming).

Step 876 of FIG. 10 includes applying data dependent voltages to individual source lines and bit lines for verifying. The fourth column of FIG. 11 (second row has header of "Verify") identifies the data dependent voltages applied to individual source lines and the ninth column of FIG. 11 (second row has header of "Verify") identifies the data dependent voltages applied to individual bit lines. For example, if a memory cell is being programmed to state S1, then in step 876 the source line receives 4.8 volts and the bit line receives 5.3 volts. If a memory cell is being programmed to state S2, then in step 876 the source line receives 4.0 volts and the bit line receives 4.5 volts. If a memory cell is being programmed to state S3, then in step 876 the source line receives 3.2 volts and the bit line receives 3.7 volts. If a memory cell is being programmed to state S4, then in step 876 the source line receives 2.4 volts and the bit line receives 2.9 volts. If a memory cell is being programmed to state S5, then in step 876 the source line receives 1.6 volts and the bit line receives 2.1 volts. If a memory cell is being programmed to state S6, then in step 870 the source line receives 0.8 volts and the bit line receives 1.3 volts. If a memory cell is being programmed to state S7, then in step 874 the source line receives 0.0 volts and the bit line receives 0.5 volts. If the memory cell is to remain in the erased state S0, then in step 874 the source line receives 6.0 volts and the bit line receives 6.0 volts.

Step 870 of FIG. 10 also include locking out memory cells that have been successfully verified to have reached their target data state. The fifth column of FIG. 11 (second row has header of "Lockout") identifies the lockout voltages applied to individual source lines and the tenth column of FIG. 11 (second row has header of "Lockout") identifies the lockout voltages applied to individual bit lines. In all cases, when a memory cell is locked out from additional programming (see step 876 of FIG. 10) the source line and bit line are set at 6 volts.

Any memory cell that should be inhibited from programming has its source line and bit line set to 6.0 volts, as per the third and eighth columns of FIG. 11 (second row has header of "Inhibit"). Note that the numerical values listed in FIG. 11 are examples, and other values can also be used.

Because memory cells being programmed to lower states receive higher source line voltages and bit line voltages, the programming pulses will cause the memory cells being programmed to lower states to increase threshold voltage at a lower rate, as per the graphs of FIGS. 9A-E. Similarly, because memory cells being verified for lower states receive higher source line voltages and bit line voltages, the verification test can use the same single verification voltage pulse on the selected word line. FIG. 13 shows a sample voltage signal applied to a selected word line. There are six Vpgm program pulses 557, 558, 559, 560, 561 and 562 that increase in magnitude, as described above. One of the program pulses is applied during each iteration of step 872 of FIG. 10. Between the Vpgm program pulses are verify pulses 570. That is, between any two Vpgm program pulses is one verify pulse that is used to concurrently verify all data states by using different source line and bit line voltages as per the table of FIG. 11. Concurrently verifying all data states saves considerable time during a programming process. One verify pulse 570 is applied during each iteration of step 874.

FIG. 12 is a table that provides example voltages for the drain side select signal (VSGD), source side select signal (VSGS), selected word line (WL N), unselected word lines on the source side of the selected word line (WL#≤N−1), and unselected word lines on the drain side of the selected word line (WL#≥N+1). For example, during verify operations the selected word line receives one voltage pulse at 5.2 volts, while the unselected word lines, source side select signal for the selected NAND string, and drain side select signal for the selected NAND string receive 6 volts, and while the unselected word lines on the source side receive 12 volts. Other voltages than 6V can be applied, and engineering optimization will determine the best voltages to apply to unselected word lines, various source side select gates, and various drain side select gates during both verify and program operations. During programming, the selected word line receives Vpgm (see FIG. 13), while the unselected word lines on the drain side, the source side select signal for the selected NAND string, and the drain side select signal for the selected NAND string receive 6 volts, and while the unselected word lines on the source side receive 12 volts. During reading, the selected word line receive Vcgr (ie Vr1, Vr2, Vr3, Vr4, Vr5, Vr6 or Vr 7), the source side select signal for the selected NAND string receives 4 volts, the drain side select signal for the selected NAND string receives 4 volts, and all unselected word lines receive 7 volts. Note that the numerical values listed in FIG. 12 are examples, and other values can also be used.

Figure 14:
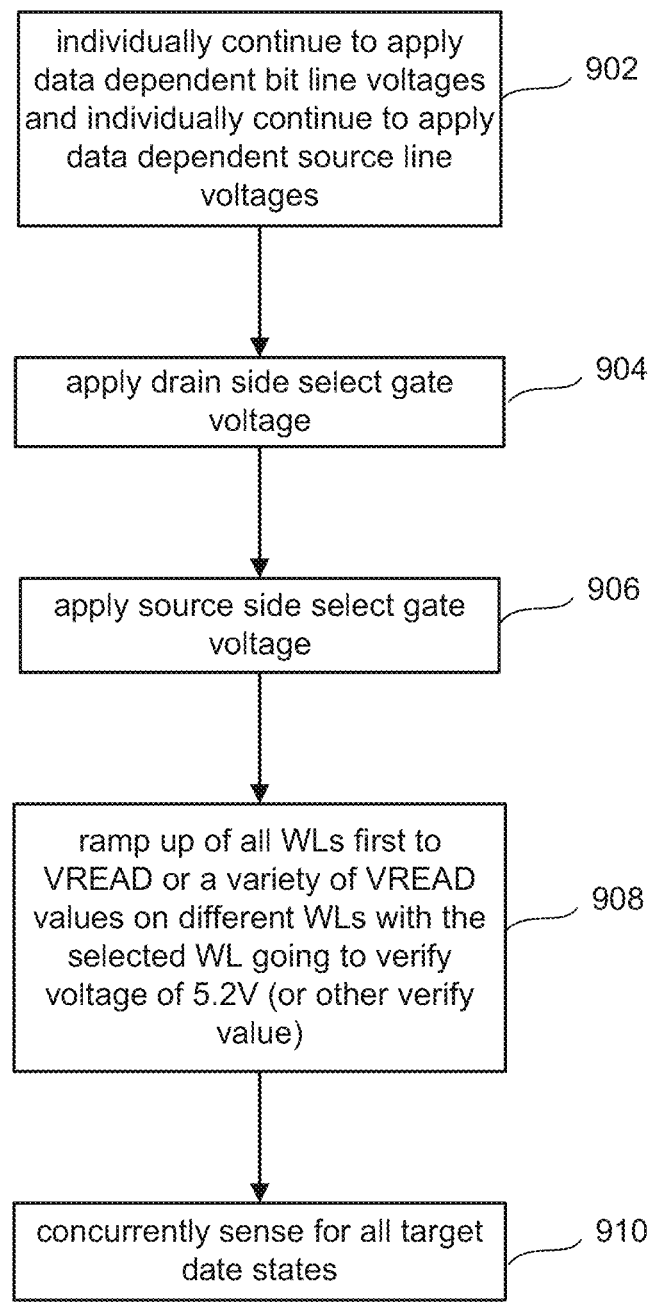
FIG. 14 is a flow chart describing one embodiment of a process for verifying.

FIG. 14 is a flow chart describing one embodiment of a process for verifying that is performed as part of step 876 of FIG. 10. The process of FIG. 14 is one way to concurrently verify all data states, which is much faster than previous approaches which verify data states serially one data state at a time. In step 902, the individual bit lines receive a data dependent signal, as discussed above, and the individual source lines receive a data dependent signal, as discussed above. In some embodiments the system continues to apply the voltage (i.e. hold the voltage from the program pulse phase), rather than bring down the voltages applied to bit lines and source lines at the end of a program pulse by discharging them, only to recharge them back up to the same (or similar) voltage for following verify operation. This saves energy.

In step 904, the drain side selection signal is applied. In step 906, the source side selection signal is applied. Steps 904 and 906 can be performed concurrently or sequentially. If performed sequentially, either 904 or 906 can be performed first. In step 910, the set of sense amplifiers concurrently perform sensing operation for all (or a subset) of the memory cells for all data states. That is, the system will sense for S0, S1, S2, S3, S4, S5, S6 and S7 at the same time. Note that in some embodiments, for verifying after the first program pulse, WLs, SGSs, SGDs, BLs, & SLs can all start to rise together in order to save time. They will reach final voltage values at different times.

In another embodiment, the system can start ramping up (raising the voltage of) the word lines, the select gates, the bit lines, and the source lines all together for the selected finger (i.e. word line portion of a word line). The bit lines and the source lines can be slower to rise due to either their RC time constants being longer or the energy requirements being more (which would necessitate an intentional controlled ramp up of these ~600,000 lines in order not to exceed maximum allowed instantaneous currents), in some embodiments word lines and select gates will reach high voltages before bit lines and source lines reach high voltages. Note that one embodiment charges the bit lines and the source lines in two stages: stage 1 takes lines to Vcc or less, and stage 2 takes those lines that have to go to higher than Vcc values from Vcc to these higher values. Each stage is allotted a minimum of 20 micro seconds based on worst case bit line or source line RC time constants. The maximum time for each stage is based on how many memory cells will require their bit lines and source lines to be raised in voltage during the BL/SL charging phase which occurs before each program pulse. Some program pulses will have very few numbers of BLs and SLs charging up to high voltages (e.g. charge ups for program pulses #2 & #6, for which the circuit is RC dominated and 20 us per stage will be adequate. But there are other charging phases when the system needs to allow more than 20 us per one or both stages of charge up before the associated program pulse. Thus, there is a pulse by pulse control of ramp up time and pulse dependent charge up times. There may be a lot of BL & SL charge up activity prior to program pulse #1.

Figure 15:
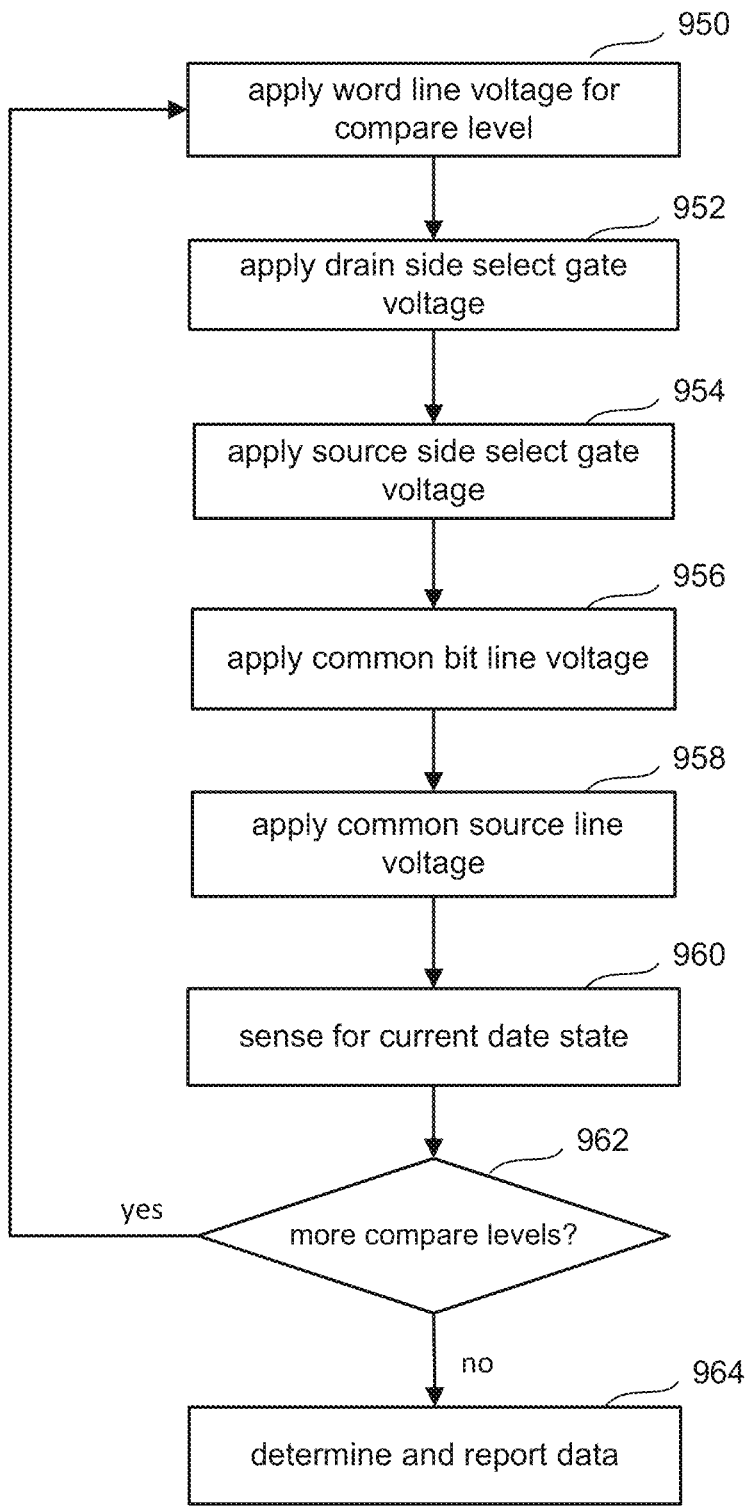
FIG. 15 is a flow chart describing one embodiment of a process for reading.

FIG. 15 is a flow chart describing one embodiment of a process for reading. Unlike verification, reading is performed sequentially. That is, the system will perform a read operation for one data state at a time. In one embodiments, the system will first read to determine which memory cells are in S0, then S1, then S2, . . . S7. In other embodiments, other orders can be implemented. Each data state is associated with its own word line voltage, referred to as Vcgr (ie Vr1, Vr2, Vr3, Vr4, Vr5, Vr6 or Vr 7). In step 950, the Vcgr voltage for the compare level (ie Vr1, Vr2, Vr3, Vr4, Vr5, Vr6 or Vr 7) is applied to the selected word line. Additionally, the unselected word line receive the voltages indicated in FIG. 14. In step 952, the drain side selection signal is applied. In step 954, the source side selection signal is applied. In step 956, the common bit line voltage is applied to all bit lines. In step 958, the common source line voltage is applied to all source lines. In step 960, the sense amplifiers will sense data for the Vcgr applied in step 950. If there are more compare levels to apply (step 962), then the process loops back to step 950. In one set of embodiments, there are seven compare levels, so there will be seven iteration of steps 950-960. When there are no more compare levels to evaluate (step 962), then the process continues at step 964 the system determines which data state each memory cell read is in and what the corresponding data stored is. That data is reported to the host.

Note that the processes of FIGS. 10 (programming), 14 (verifying) and 15 (reading) can be performed together in any combination, separate, concurrently, serially or in another manner.

In one embodiment, erasing is performed in the same manner as in the prior art. In another embodiment, erasing is performed by taking advantage of Gate Induced Drain Leakage ("GIDL"). In another embodiment, erasing is performed by the "gated diode effect," which comprises electron-hole generation assisted by bias across a PN junction and a nearby gate's assisting in increasing the electric field needed to generate electron hole pairs.

In one embodiment, immediately after programming, a read operation is performed to make sure that the bit error rate is sufficiently low. Note that ECC can be used to fix a number of bit errors.

FIG. 16 is a table of voltages used during programming and verification of programming for selected word lines (WLn) in selected block for program/verify and shows the transition of waveforms for the first two program pulses and the associated verify operations. The remaining operations are the same as the second program pulse (i.e. repeats of stages 2.1 to 2.7). The last program pulse (6th pulse in this example) does not require a verify in some embodiments and its stages 6.1 to 6.5 are similar to other program pulses' corresponding stages. An addition step 6.6 during which all lines are brought back to ground will bring the program verify sequence to an end. The voltages and timings serve as examples and can be different in various scenarios. Even the sequence of events can be changed to some extent. Other than the first column of labels, each column shows voltages during a different stage of operation. The first program pulse has seven stages: 1.1, 1.2, 1.3, 1.4, 1.5, 1.6 and 1.7. The second program pulse also has seven stages: 2.1, 2.2, 2.3, 2.4, 2.5, 2.6 and 2.7. Stages 1.1, 1.2 as well as 2.1 and 2.2 are an example implementation of step 870 of FIG. 10. Stages 1.4 and 1.5 as well as 2.4 and 2.5 are example implementation of step 872 of FIG. 10. Stages 1.7 and 2.7 are example implementations of step 876 of FIG. 10, as well as the process of FIG. 14. The table shows voltages for the four source side select lines (SGS0, SGS1, SGS2, SGS3), the four drain side select lines (SGD0, SGD0, SGD0, SGD3), the two drain side dummy word lines (WLDD1, WLDD2), the two drain side dummy word lines (WLDS1, WLDS2), the selected word line WLN, unselected word lines (WL0, WL<N−1, WLN−1, WLN+1, WL>N+1, WL47), source lines and bit line. With respect to the stage number, the digit to the left of the decimal point indicates the program pulse associated with the iteration of the programming process and the digit to the left of the decimal point refers to the sub stage (.1-.7).

The first two sub stages for the first program pulse include setting the various bit line and source voltages to their data dependent values. This is done in two stages, with the first stage (1.1) bringing the bit lines and source line to the lower of their target or VCC (~3.1 v). The other signals are depicted to transition from 0 to the values noted. For example, SGS0 shows "048" which represents a transition from 0 volts to 8 volts. In the second stage (1.2), the bit lines and source lines are raised from VCC to their targets (if they were not already at their targets). In third stage (1.3), the drain side select lines and source side select lines are lowered. The third stages (i.e. 1.3, 2.3, . . . , 6.3) can be eliminated in some embodiments for all program verify pulses. If they are to be eliminated, then select gate source and drain voltages are raised only to 6 v as opposed to 8 v in the first stages (i.e. 1.1, 2.1, . . . , 6.1). In the fourth stage, the word lines are raised to Vpass (e.g., 7-10 volts) to boost unselected NAND strings and prevent program disturb. In the fifth stage (1.5), the program pulse is applied. In the sixth stage (1.6), the system transitions to verify without bringing all of the signals down to 0 volts. In one embodiment, the system transitions to verify without bringing any of the listed signals down to 0 volts (or another resting or transition voltage). In the seventh stage, concurrent verification is performed. The stages for the second and subsequent program pulses are similar to the first program pulse, except in the first stage (e.g., 2.1, 3.1, 4.1, 5.1, and 6.1), the transition of voltages is from the previous verify voltage levels rather than 0. For some of the sub stages, the bit line voltage shows "x or 6" which represents applying the data dependent value x or 6 volts because the memory cell is locked out.

Note that chart of FIG. 16 shows the voltages for SGS0, SGS1, SGS2, and SGS3 as well as SGD0, SGD0, SGD0, and SGD3. The depicted voltages are for the instances when the particular select lines are selecting the NAND strings that include the selected memory cells. Typically, only one of SGS0, SGS1, SGS2, and SGS3 and only one of SGD0, SGD0, SGD0, and SGD3 will be turned on. In some embodiments SGS0, SGS1, SGS2, and SGS3 are tied to each other in any one block and can simply be referred to as SGS. In such case WL selection can be achieved by selectively turning on one of the 4 SGDs. In some embodiments SGD0, SGD1, SGD2, and SGD3 are tied to each other in any one block and can simply be referred to as SGD. In such case WL selection can be achieved by selectively turning on one of the 4 SGSs.

In one embodiment, the memory system does not necessarily have to have its bit lines below memory layers and its source line above. There can be embodiments with bit lines above the memory and source lines below the memory.

There is a description above of two stage charging for the bit lines and source lines. In other embodiments, three stage charging can be used for the bit lines and source lines. Three stage charging could become useful, if Vcc<6/2=(BL/SL voltage for inhibit)/2. Then stage 1 takes the lines to Vcc or below, stage 2 to takes the lines to slightly lower than 2*Vcc, and stage 3 takes the lines to voltages above slightly lower than 3*Vcc.

The above-described architecture reduces the number of program pulses and verify pulses, which results in an increase in performance of the memory system. As described, the time needed for verification is dramatically reduced as all states are verified simultaneously. Additionally, because the bit lines are below the stack, there is no need for bit line interconnects that run from below to above the stack, which saves space. Since there is only one word line per block per level, as opposed to multiple word lines on a level, the word line RC is reduced and less space is needed. Additionally, locating the bit line drivers (sense amplifiers) below the stack also save room on the integrated circuit.

If, in some embodiments, programming all states concurrently or verifying all states concurrently proves too costly (e.g. too much leakage or disturb or too complex BL drivers), the system can instead deploy a scheme that would break each program pulse into two sets: one set geared for states A, B, and C, and the other set geared for states D, E, F, and G for example. For A to C states the Vpgm pulse will start at 16.2V, and when E to G are to be programmed the first pulse for these states starts at 19V. Verify can also be broken up into two sets. This provides semi-concurrency. It will reduce the performance gain and may increase energy per bit programmed, but it may be the last resort to some leakage, or disturb problem due to very high bit line and source line voltages of full concurrent program and verify, or reducing the number of transistor in each of the ~300,000 bit line drivers. Also, since it will reduce bit line and source line voltage requirements, it will be able to eliminate or significantly reduce the need to pump up the bit line and source line voltages that have to charge up and maintain voltages significantly higher than VCC.

Another embodiment includes adding more pads to memory chips to bring in other voltage supplies in addition to Vcc. For example, the system can bring as many as 6 other voltages from the outside onto the chip (not just 0 v & Vcc).

An example would be to supply 0, 0.8, 1.6, 2.4, 3.2, 4.0, 4.8, & 6.0V from outside the chip. Another example is to bring 0, 0.9, 1.7, 2.5, 3.3, 4.1, 4.9, and 6.1V from outside and regulate them down to supply 0, 0.8, 1.6, 2.4, 3.2, 4.0, 4.8, & 6.0V. This will allow the memory chips to run a lot cooler by not having to use charge pumps to pump up about 600,000 bit lines and source lines to voltages that go as high as 6V. On solid states drives (e.g., SSDs and ESSDs) it may be easier to generate these voltages off chip. If these pads are on the chip and the circuits that accompany them as well, the system will have the option to use them or not depending on the type of product being offered.

Figure 17A:
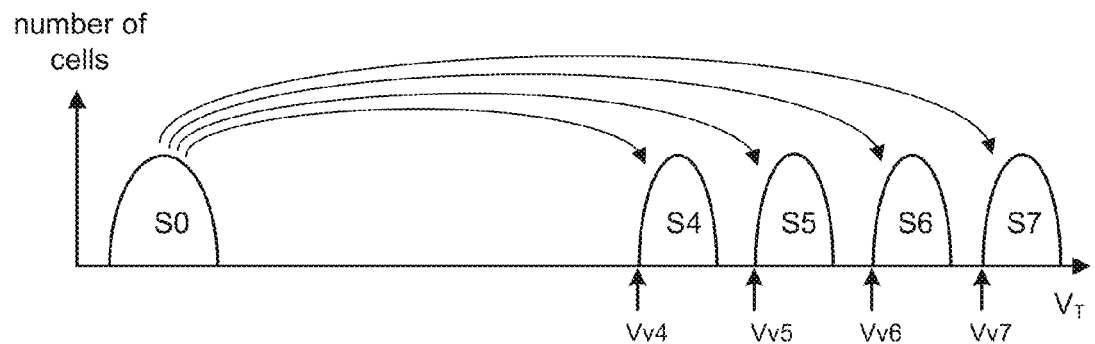
FIG. 17A depicts threshold voltages and programming a first pass of a multi-pass programming process that programs high states first.

Looking back at FIG. 8, full sequence programming is depicted by the arrows from data state S0 to data states S1-S7. Rather than implement full sequence programming, or in addition to implementing full sequence programming, some embodiments implement high states first programming (also known as HSF programming). In general, HSF programming is a multi-pass programming process. During an earlier pass of the multi-pass programming process memory cells to be programmed to the higher data states are programmed and during a later pass of the multi-pass programming process memory cells to be programmed to the lower data states are programmed In one embodiment, the higher data states includes S4, S5, S6 and S7, while the lower data states include S1, S2 and S3. In other embodiments, the higher data states and the lower data states can include different groupings of data states. In one embodiment, the multi-pass programming process includes two passes; however, other embodiments can use more than two passes, FIG. 17A depicts programming a first pass of a multi-pass programming process that programs high states first. During this first pass, memory cells to be programmed from data state S0 to the higher data states S4, S5, S6 and S7 are programmed. The first pass can be implemented using the process of FIG. 10.

Figure 17B:
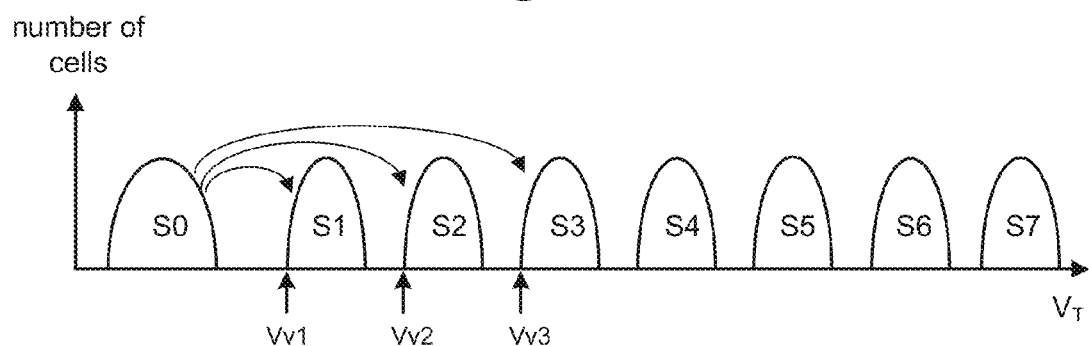
FIG. 17B depicts threshold voltages and programming a second pass of a multi-pass programming process that programs high states first.

FIG. 17B depicts programming a second pass of the multi-pass programming process that programs high states first. During this second pass, memory cells to be programmed from data state S0 to the lower data states S1, S2 and S3 are programmed. The second pass can be implemented using the process of FIG. 10.

FIG. 18 is a table of voltages used during programming and verify for the first pass of the multi-pass programming process that programs high states first. The voltages depicted in FIG. 18 are used to implement the programming of FIG. 17A using the process of FIG. 10.

FIG. 19 is a table of voltages used during programming and verify for the second pass of the multi-pass programming process that programs high states first. The voltages depicted in FIG. 19 are used to implement the programming of FIG. 17B using the process of FIG. 10.

FIGS. 18 and 19 depict the voltages for the source line (SL) of a memory cell selected for programming, the appropriate source side select line of the four possible source side select lines (see 4×SGS), the source side dummy word lines (2×WLDS), the selected word line connected to the memory cells selected for programming (WLN), the unselected word lines (WL0, WL1→N−1 and WLN+1→46, WL47), the drain side dummy word lines (2×WLDD), the appropriate drain side select line of the four possible drain side select lines (see 4×SGD), and the bit line (BL) of a memory cell selected for programming. As discussed above, a word line connects to all memory cells on a same layer of the memory array 126. The source side select lines and the drain side select lines are used to select a subset (e.g., ¼) of memory cells (and NAND strings). Thus, programming (including verification) is performed on the selected subset (also referred to as a page). The source side select line and the drain side select line associated with the selected subset of memory cells (the source side select line and the drain side select line used to select the selected subset of memory cells) receive the voltages depicted in FIGS. 18 and 19. The source side select lines and the drain side select lines associated with the unselected subsets of memory cells receive 0 volts.

As mentioned above, it is proposed to program non-volatile memory cells (including verifying the programming) without performing a scan operation. During each verify operation the sense amps decide which cells to lock out of the next programming pulse. Following the verify operation, the results of these sense amp decision are implemented in the form of raising the bit line and the source line voltages to the inhibit value during the pre-charge operation just preceding the next program pulse. Monitoring the global current consumption, Icc, during the pre-charge operation provides an indication of how many cells were detected to need to be locked out of programming in the prior verify operation. As a memory cell transitions from being programmed to being locked out, its associated bit line will be moved to a higher voltage (ie lockout voltage) which draws more current. Therefore, monitoring current drawn by the memory die will be indicative of the number of memory cells transitioning from being programmed to being locked out. The memory system can keep track of the current monitored after several verify operations and feed these monitored current values into an algorithm for comparing to a reference (including, for example, one or more reference sets of current values) to determine whether the monitored current values indicate that enough memory cells have been successfully programmed so that the programming process is complete.

Figure 20:
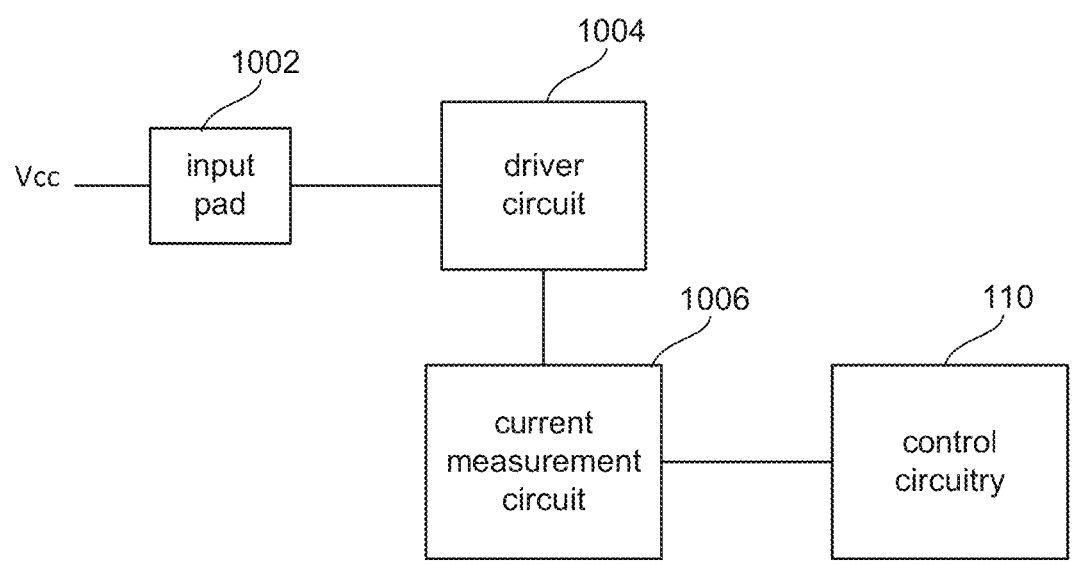
FIG. 20 is a block diagram of one embodiment of a subset of components on a memory die.
Figure 21:
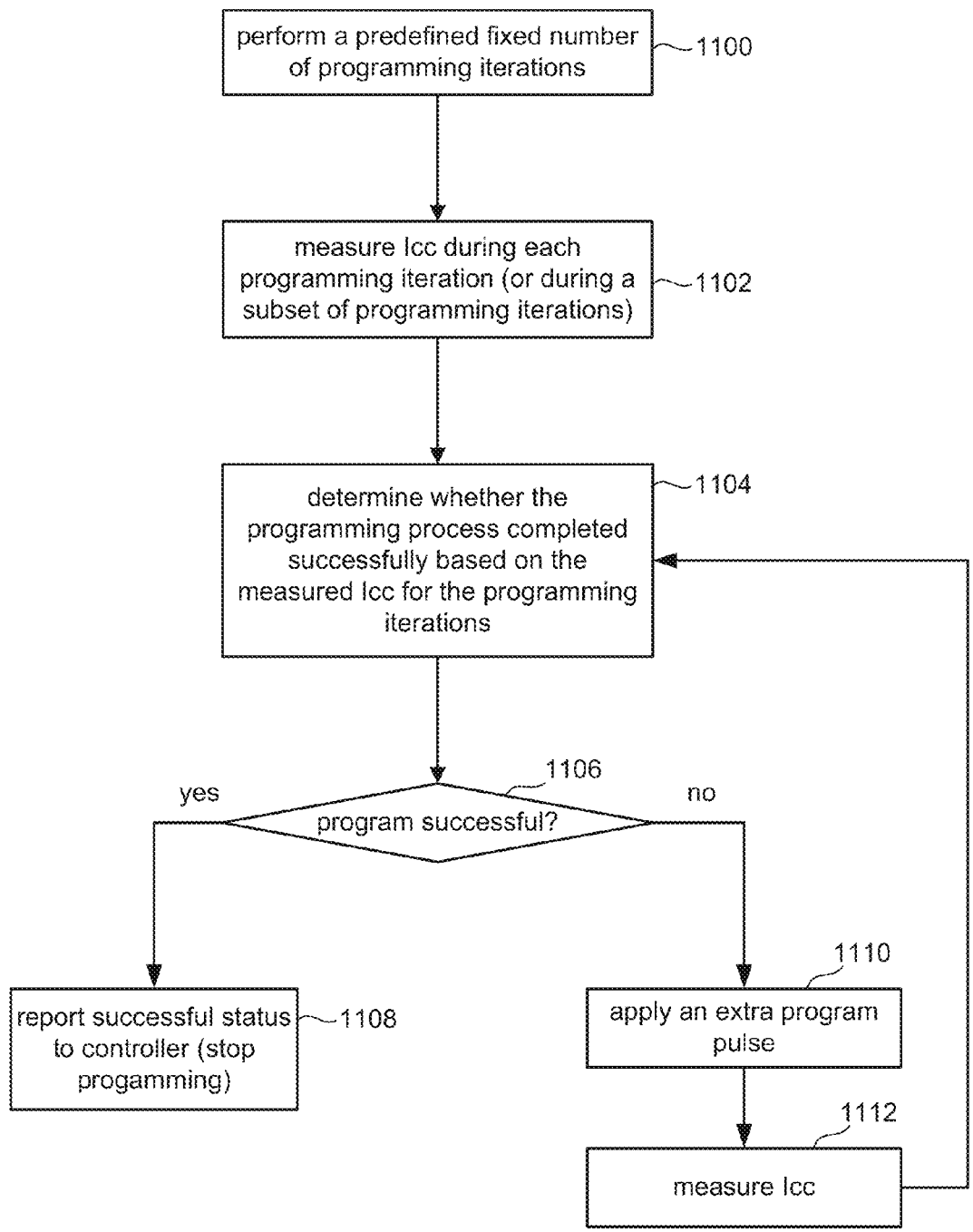
FIG. 21 is a flow chart describing one embodiment of a process for determining whether enough memory cells have been successfully programmed so that a programming process is complete.

FIG. 20 is a block diagram of one embodiment of a subset of components on a memory die 108 that are involved with determining whether enough memory cells have been successfully programmed so that the programming process is complete. FIG. 21 is a flow chart describing one embodiment of a process performed by the components of FIG. 20 for determining whether enough memory cells have been successfully programmed so that the programming process is complete.

FIG. 20 shows input pad 1002 receiving Vcc. In one embodiment, Vcc is the power supply provided to memory die 108. Driver circuit 1004 is connected to input pad 1002 for receiving Vcc. Driver circuit 1004 is used to drive Vcc to the other components of memory die 108. Vcc provided to input pad 1002 can be regulated or unregulated, depending on the implementation. In some embodiments, memory die 108 can include multiple input pads (and multiple driver circuits) that receive one or more versions of Vcc. The output of driver circuit 1004 is Vcc which is provided to control circuitry 110 for performing any of the various memory operations. FIG. 20 also shows a current measurement circuit 1006 connected to driver circuit 1004 and control circuitry 110. In some embodiments, current measurement circuit 1006 can be directly connected to input pad 1002 or any of the internal power supply lines on memory die 108 that provide Vcc or a derivative of Vcc (or another supply). Current measurement circuit 1006 is an electrical circuit that is configured to sense an indication of the current on the power supply line (e.g., at input pad 1006, at driver circuit 1004 or on any of the internal signal lines that provide Vcc). Current measurement circuit 1006 will provide that indication of the current to control circuitry 110. In one embodiment, control circuitry 110 (e.g., state machine 112 or another circuit) is configured to determine whether the programming of the memory cells has been successful based on the indication of current provided by current measurement circuit 1006.

There are many circuits known in the art that can measure current. The following four papers provide examples of suitable current measurement circuits: (1) "A Monolithic Current Mode CMOS DC-DC Converter With On-Chip Current Sensing Technique," Cheung Fai Lee and Phillip K. T. Mok, IEEE Journal Of Solid State Circuits, Volume 39, No. 1, January 2004; (2) "On-Chip Current Sensing Technique For CMOS Monolithic Switch-Mode Power Converters," Cheung Fai Lee and Phillip K. T. Mok, IEEE International Symposium On Circuits And Systems, 2002, Vol. 5; (3) "Current-Sensing Techniques For DC-DC Converters," Hassan Pooya Forghani-Zadeh and Gabriel A. Rincon-Mora, The 2002 45th Midwest Symposium On Circuits And Systems, Aug. 4, 2002; (4) "CMOS Continuous-Time Current-Mode Filters for High Frequency Applications," Sang-Soo Lee, Rajesh H. Zele, David J. Allstot, and Guojin Liang, IEEE Journal of Solid State Circuits, Vol. 28, No. 3, March 1993. Each of these four papers is incorporated herein by reference in their entirety. Other current sensing circuits can also be used with the technology proposed herein.

FIG. 21 is a flowchart describing one embodiment of a process performed by the components of FIG. 20 for determining whether or not memory cells have been successfully programmed so that the memory process is complete. The process of FIG. 20 is one example implementation of step 880 of FIG. 10. In step 1100, the system performs a predefined fixed number of programming iterations. For example, as discussed above with respect to FIG. 10, in one embodiment the system will perform six programming iterations. Furthermore, as explained above with respect to FIGS. 10 and 16, each programming iteration includes a pre-charge phase and a program pulse. At least a subset of the program iterations include a verify phase. In one embodiment, all programming iterations include a verify phase. In some embodiments, the last programming iteration will not include a verify phase. Because each programming iteration includes a program pulse, each program iteration thereby includes some dose of programming. Note that step 1100 (programming) is performed by the components depicted in FIG. 1B, which include control circuitry 110 and memory array 126.

In step 1102, the system measures Icc during the bit line pre-charge phase which precedes each programming pulse (or during a subset of program pulse iterations). That is, current measuring circuit 1006 of FIG. 20 measures the current at some point during each programming iteration. In one embodiment, Icc is measured during all program iterations. In another embodiment, Icc is only measured during a subset of programming iterations. For example, in some implementations, the first one or two programming iterations will not include a measurement of the Icc. The changing of the bit line from the data dependent voltage (see FIGS. 11, 18 and 19) to the lockout voltage (see step 876 of FIG. 10 in the table of FIG. 11) causes an increase in current on a power supply line for memory die 108. The measuring of current in step 1102 includes detecting the increased current on the power supply line due to the changing of the bit line for the data dependent voltage to the lockout voltage.

In step 1104, the system determines whether the programming process has completed successfully based on the measured current (e.g., Icc) for the programming iterations. In one embodiment, successful programming means that all memory cells have reached their target data state. In other embodiments, successful programming means that enough cells have reached their target data state such that the remaining number of memory cells that have not reached their target data state is less than the number of bits that can be corrected by error correction codes (ECC). Therefore, step 1104 includes control circuitry 110 (e.g., state machine 112 or another dedicated circuit) determining (in some embodiments estimating) if the number of memory cells that have reached their data state is sufficient based on the measured current values from each of the programming iterations measured. In step 1106, the system (e.g., state machine 112) determines whether the programming was successful based on the determination in step 1104. If the programming did complete successfully, then in step 1108 memory die 108 reports to the controller the status of the programming process as being successful. The programming process is stopped, as being completed.

If, in step 1106, it is determined that the programming was not completed successfully, then in step 1110 the system applies an extra program pulse. For example, steps 870 and 872 of FIG. 10 can be performed. As part of performing the programming in step 1110, the system will measure current (e.g., Icc) in step 1112. After steps 1110 and 1112, the process loops back to step 1104.

The embodiment discussed above includes applying an extra programming pulse if programming do not completes successfully. In some embodiments, only one extra program pulse is applied. In other embodiments, the system will keep applying program pulses until programming has completed successfully. In another embodiment, the no extra programming pulses will be applied and the system will report its status of program failure to the controller.

Figure 22:
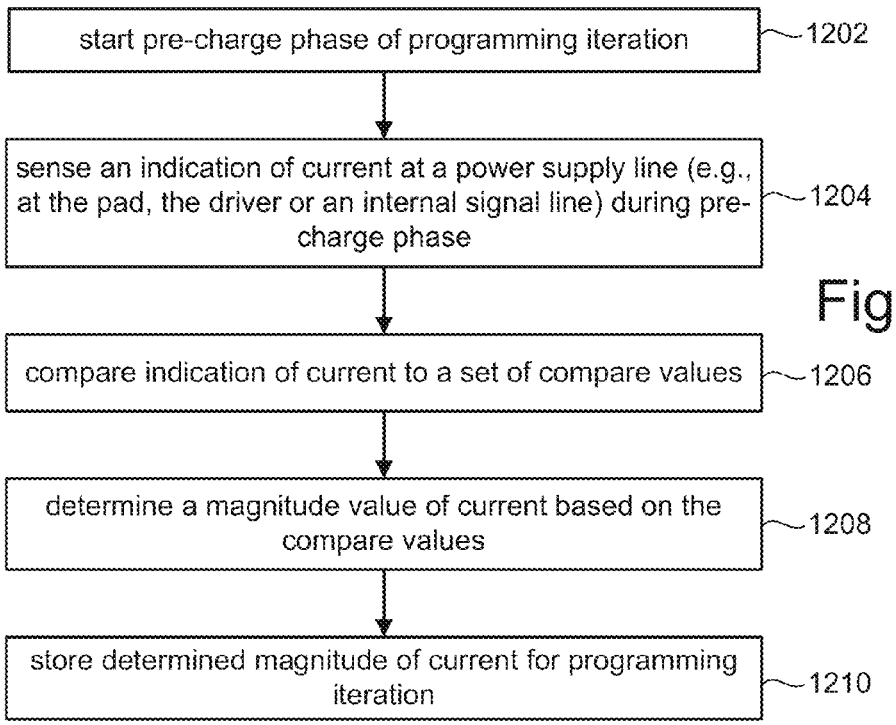
FIG. 22 is a flow chart describing one embodiment of a process for measuring current.

FIG. 22 is a flow chart describing one embodiment of a process for measuring current. The process of FIG. 22 is an example of implementation of step 1102 performed by current measurement circuit 1006. In some embodiments, a portion of the process of FIG. 22 can also be performed by components of control circuitry 110. In step 1202 of FIG. 22, the system (e.g., control circuitry 110) will start the pre-charge phase of the programming iteration. As discussed above, in one embodiment, each programming iteration includes a pre-charge phase and a program pulse. Stage 1.1 and stage 1.2 of FIG. 16 correspond to the pre-charge phase for bit lines for a first programming iteration. Stage 1.5 of FIG. 16 corresponds to the program pulse for the first programming iteration. Additionally, Stages 2.1 and 2.2 correspond to the pre-charge phase for a second programming iteration. Stage 2.5 corresponds to the program pulse for the second programming iteration. In one embodiment, the system will sense current during the pre-charge phase. Thus, in step 1204, current measurement circuit 1006 senses an indication of current at the power supply line (e.g., at the pad, the driver, or internal signal line) during the pre-charge phase.

In step 1206, the system compares the indication of current sensed to a set of compare values to determine a magnitude of current. In one embodiment, step 1206 is performed by current measurement circuit 1006. In another embodiment, control circuitry 110 performs step 1206 based on the indication of current sensed in step 1204 by current measurement circuit 1006. In step 1208, the system determines a magnitude of the current value based on the compare values from step 1206. In one embodiment, step 1208 is performed by current measurement circuit 1006. In another embodiment, control circuitry 110 performs step 1208 using the sensed indication of current from current measurement circuit 1006. In step 1210, the system (e.g., control circuitry 110) stores the determined magnitude of the current for the programming iteration. In one embodiment, the process of FIG. 22 is performed for each programming iteration. In an embodiment that has six programming iterations, the process of FIG. 22 is performed six times, thereby, storing six current values (one current value for each programming iteration). In other embodiments, the process of FIG. 22 is only performed for a subset of programming iterations.

Figure 23:
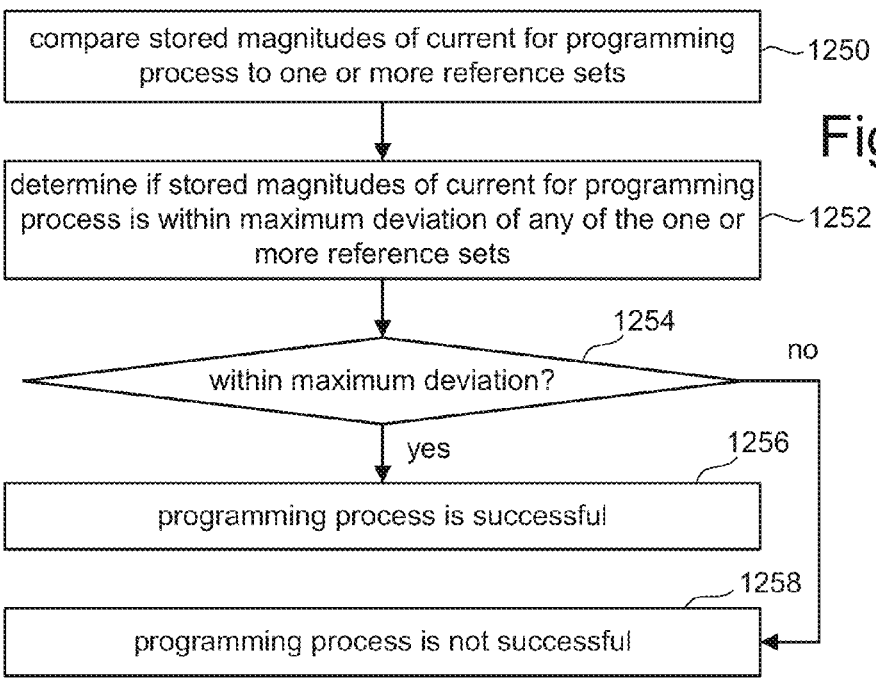
FIG. 23 is a flow chart describing one embodiment of a process for determining whether the programming process completed successfully based on the measured current for the programming iterations.

FIG. 23 is a flow chart describing one embodiment of a process for determining whether a programming process completed successfully based on the measured current for the multiple programming iterations. That is, the process of FIG. 23 is an example implementation of step 1104 of FIG. 21. In one embodiment, the process of FIG. 23 is performed by control circuitry 110 (e.g., state machine 112). In step 1250, the system compares the magnitudes of the current programming process (one current magnitude for each programming iteration) to one or more referenced sets of current values. In an embodiment where there are six programming iterations and the system senses and stores one current value for each programming iteration, then a reference set of current values will also include six current values. Based on the design and simulation, engineers can determine one or more reference sets of current values that are expected to be experienced when a sufficient number of memory cells have been programmed successfully. In step 1252, the system will determine if the stored magnitude of currents for the programming process is within a maximum deviation of any of the one or more reference sets of current values. There is a chance that the current values measured for the current programming process will not exactly match any of the reference sets. Thus, the system will determine the deviation between the current set of current values sensed and any of the reference sets. If the current values measured for the programming iterations is close enough to any one of the reference sets (within maximum deviation—step 1254) then the programming process is considered to be successful (step 1256). Otherwise, the programming process is not successful (step 1258). In some embodiments, rather than comparing measured current, the system compares an integral (or other mathematical function) of the measured current.

Figure 24:
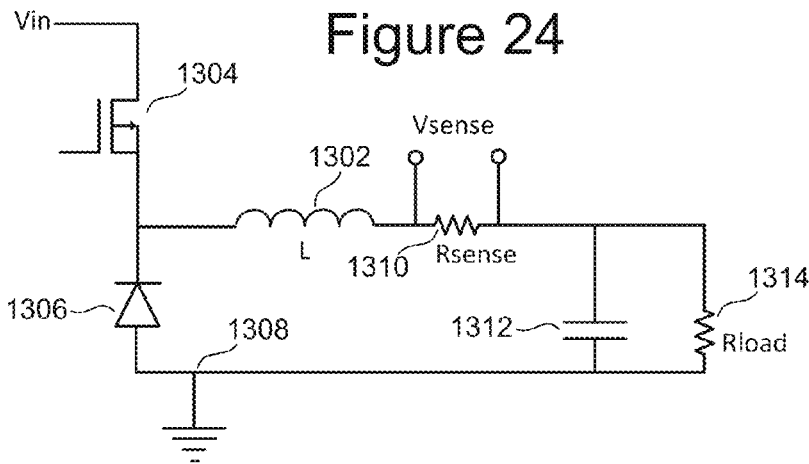
FIG. 24 is a schematic of one embodiment of a circuit that measures current.
Figure 25:
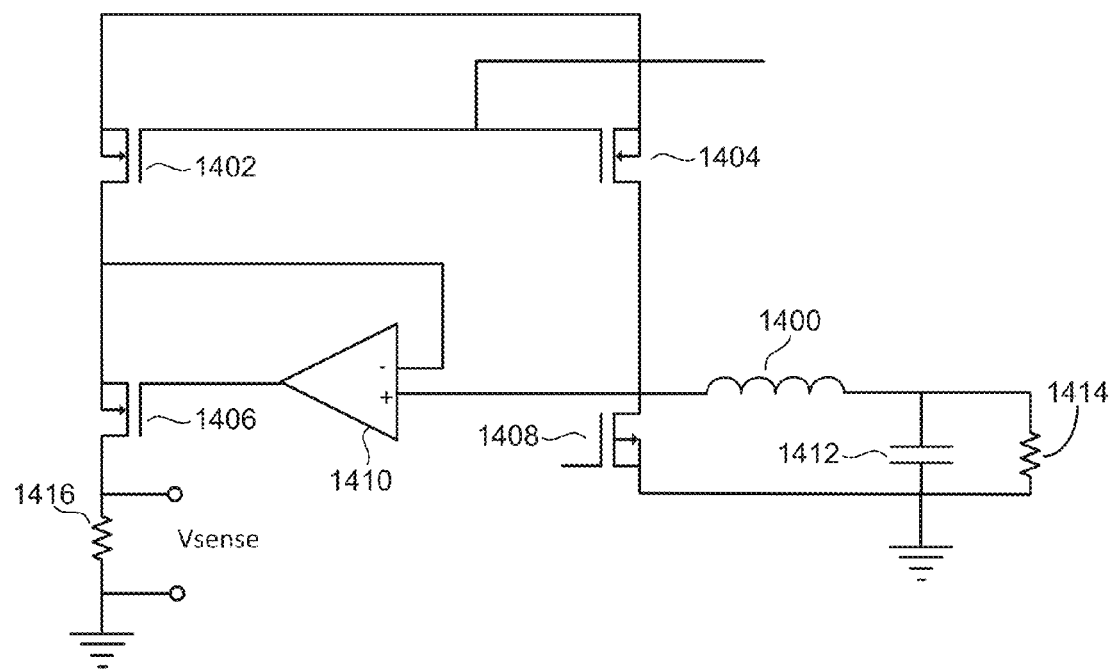
FIG. 25 is a schematic of one embodiment of a circuit that measures current.
Figure 26:
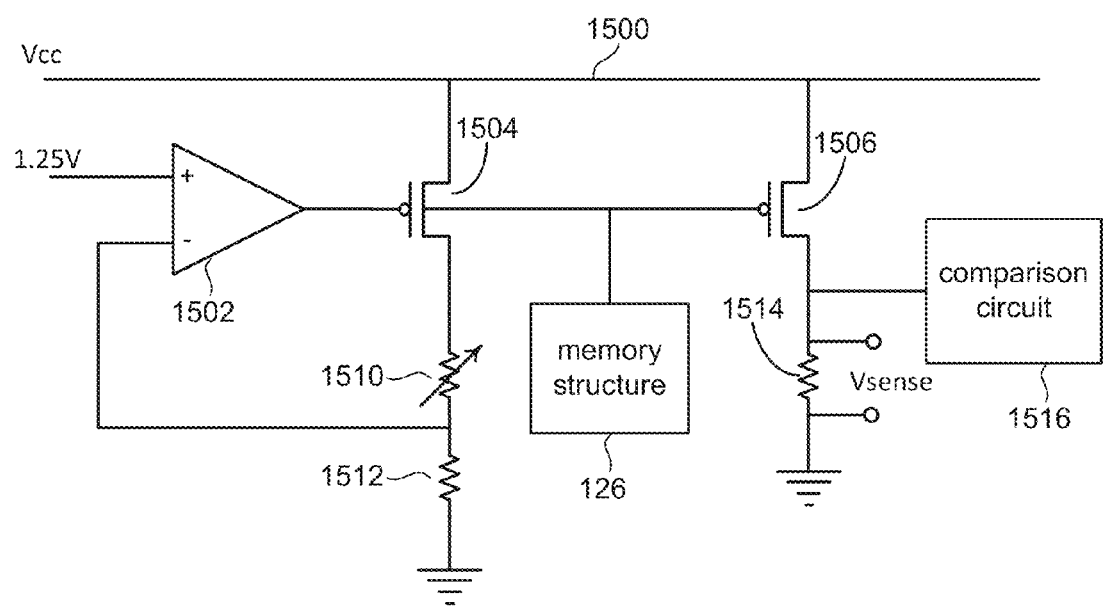
FIG. 26 is a schematic of one embodiment of a circuit that measures current.

FIGS. 24, 25 and 26 provide examples of current measurement circuits 1006. These circuits are only provided for example purposes. Many other circuits can also be used.

FIG. 24 shows a current measurement circuit based on inductor 1302. In one embodiment, the inductor can be wrapped around the metal line that carries the power supply signal (Vcc). In another embodiment, an inductor can be arranged adjacent to a power line. For purposes of an inductor, being wrapped around and being adjacent are both considered an electrical connection. One end of inductor 1302 is connected to the source of P-channel depletion mode MOSFET 1304 and diode 1306. The drain of MOSFET 1304 is connected to Vin. The input of diode 1306 is connected to node 1308, which is tied to ground. The other side of inductor 1302 is connected to resister 310 (Rsense). The other end of resister 1310 is connected to capacitor 312 and resister 314 (Rload). Capacitor 1302 and resister 1314 are also connected to node 1308 (tied to ground). The voltage across resister 1310, noted as Vsense, is representative of the current one the power supply line that is being monitored by inductor 1302.

FIG. 25 is a schematic diagram of a circuit providing another embodiment of current measurement circuit 1006 that uses inductor 1400. The circuit of FIG. 25 includes N-channel depletion mode MOSFET 14402, N-channel depletion MOSFET 1404, N-channel depletion mode MOSFET 1406 and P-channel depletion mode MOSFET 1408. The gate of MOSFET 1402 is connected to the gate of MOSFET 1404. The source of MOSFET 1408 is connected to the source of MOSFET 1404. The drain of MOSFET is connected to the source of MOSFET 1406 and the negative input of operational amplifier 1410. The drain of MOSFET 1406 is connected to one side of resister 1416. The other side of resister 1416 is connected to ground. The voltage across resister 1416, labeled Vsense, is indicative of the current on the power supply signal being monitored by inductor 1400. The drain of MOSFET 1404 is connected to the drain of MOSFET 1408. The positive input to operational amplifier 1404 is connected to one side of inductor 1400 which can be wrapped around or adjacent to the power supply line being monitored. The other end of inductor 1400 is connected to capacitor 1412 and resister 1414. Capacitor 1412 and resister 1414 are also connected to the source of MOSFET 1408, which is also connected to ground.

The circuit of FIG. 25 uses a current sensing MOSFET and parallel with a power MOSFET and use its measuring capability for sensing the current. The effective width of the sensing MOSFET is significantly smaller than the power MOSFET. For example, in some cases, the width of the power MOSFET should be at least 100 times the width of the sense MOSFET to guarantee the consumed power in the sensing MOSFET is low and quasi-lossless. In the circuit of FIG. 25, MOSFET 1404 is the power MOSFET and MOSFET 1402 is the sensing MOSFET. The operational amplifier 1410 is used to force the drain voltages of MOSFET 1404 and 1402 to be equal.

FIG. 26 is a schematic diagram of a circuit that represents another embodiment of current measurement circuit 1006. FIG. 26 shows power supply line 1500 carrying Vcc. The circuit includes operational amplifier 1502, P-channel enhancement mode MOSFET 1504, P-channel enhancement mode MOSFET 1506, variable resister 1510, resister 1512, resister 1514 and comparison circuit 1516. The drain of MOSFET 1504 and the drain of MOSFET 1506 are connected to power supply line 1500. The gate of MOSFET 1504 is connected to the output of operational amplifier 1502. the gate of MOSFET 1506, and memory array 126. The positive input of operational amplifier 1502 is provided with 1.25 volts. The source of MOSFET 1504 is connected to one end of variable resister 1510. The other end of variable resister 1510 is connected to resister 1512 and the negative input to operational amplifier 1502. The other end of resister 1512 is connected to ground. The source of MOSFET 1506 is connected to one end of resister 1514 and comparison circuit 1516. The other end of resister 1514 is connected to ground. The voltage across resister 1514 (labeled as Vsense) represents the current through power supply line 1500. Comparison circuit 1516 can be any circuit that compares the voltage Vsense to one or more compare values (see step 1206) in order to determine the value of the current based on those compare values (step 1208).

Figure 27:
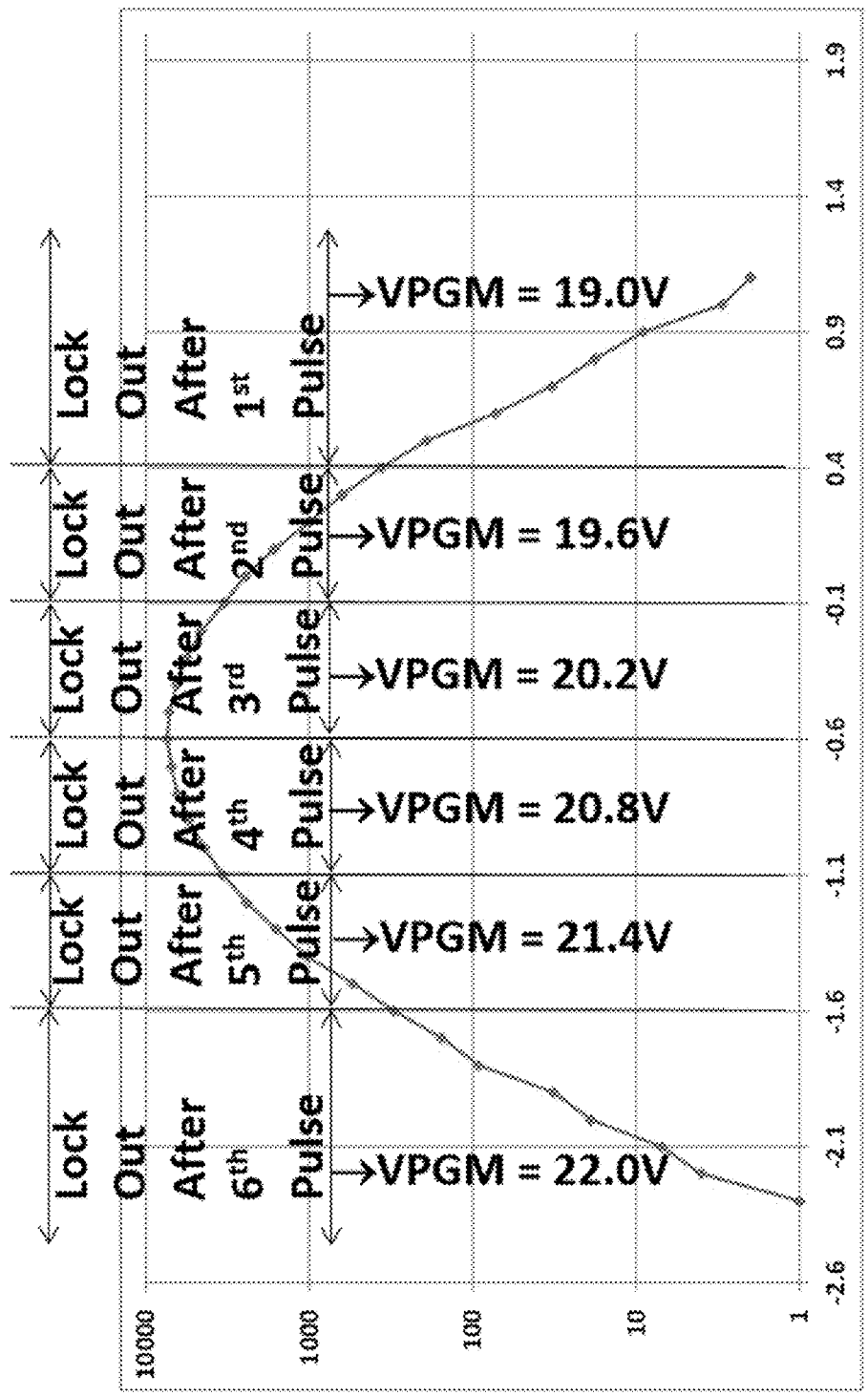
FIG. 27 depicts the natural distribution of threshold voltages for programming.

FIG. 27 depicts one example of the natural distribution of threshold voltages for programming, which shows the statistical variation of the response of the memory cells to the same sequence of program pulses where all memory cells receive the same number of pulses and yet their threshold voltages can have a wide range. FIG. 27 can be used to describe some embodiments, and shows an example of which memory cells would be locked out after each programming pulse. The distribution of the memory cell threshold voltages typically is close to a normal distribution (i.e.

Gaussian). Sometimes a skew can be found and in such cases the distribution is well represented by Weibull distributions. See, for example, U.S. Pat. Nos. 7,907,449 and 8,264,890 both titled "Two Pass Erase for Non-Volatile Storage." The set of current values, or more properly, the set of integration of current values over the pre-charge times, measured during the pre-charge phases preceding each program pulse should be considered in relation to one another. The pre-charge phase before the first program pulse is extremely energy intensive as roughly half the bit lines are driven to lock out voltage when a two pass (e.g. HSF) programming operation is employed. In one embodiment, this first pulse's current integral over the pre-charge time does not provide information about the position of the natural distribution for the page being programmed in this measurement. On the other hand, this measurement can be used as a calibration quantity by which all subsequent measurements can be normalized. In other words, every subsequent current integral measurement result can be viewed as a percentage of this measurement's result.

If the starting program voltage, VPGM, is too low, then no memory cells will lock out during the second program pulse's pre-charge phase and measured current integral will be too low. If the starting VPGM was just right, then still the second pulse's pre-charge phase will draw very little current as only a very small number of memory cells will be locking out. Please note that the Y-axis of the plot is on a log scale. On the other hand, if the starting VPGM is exceedingly high, then the measured current integral could be higher than expected and this can raise a flag about VPGM being too high. This could trigger the system to do a read back after programming is finished and find if number of errors are within acceptable limits. The third program pulse's pre-charge phase should have exponentially higher number of memory cells locking out with respect to the second one, and hence have higher current integral measured. The fourth program pulse's pre-charge phase should have again exponentially higher number of memory cells locking out with respect to the number of memory cells locking out during the third pulse's pre-charge phase, drawing significantly more current integral during its pre-charge. The fifth pulse's pre-charge phase should have similar number of memory cells locking out with respect to the fourth pulse's pre-charge phase as long as the starting Vpgm was chosen correctly and the width of the natural distribution of programming has not changed with respect to its expected width. The sixth pulse's pre-charge phase should see an exponential drop in the number of memory cells that need to be locked out with respect to the number that locked out during the fifth pulse's pre-charge phase. So, in some embodiments, the sixth pulse's pre-charge phase current draw over time (current integral) should be similar to third pulse's current draw over time as long as choice of starting Vpgm and assumption about the width of the natural distribution were correct. If these assumptions were not correct, then the relation of the current integrals during the pre-charge phases of the various program pulses will deviate in one way or another from the expected ratios of measured current integrals.

It is anticipated that the pre-charge phases of the first, fourth and fifth program pulses will be so current and energy intensive that some embodiments may elongate the duration of these particular pre-charge phases, whereas the other pre-charge phases (i.e. second, third and sixth) will not require any such elongation and their pre-charge times are dictated by RC concerns rather than power requirements. Because of this, the correct figure of merit that indicated the energy requirement of each pre-charge phase is an integration of current over the duration of the pre-charge phases. This integration of current provides information on how much energy was required to charge various bit lines against their neighbor bit lines. The following flexibility can be built in the design of the memory die where the pre-charge phase timing is not predetermined, but depends on when voltages that may have drooped because of too much loading eventually rise back to their designated targets.

An integration of the current over the entire variable duration of each pre-charge phase (i.e. a figure proportional to energy requirement for each pre-charge phase) is then the correct figure of merit to be captured and compared from one pre-charge phase to another. The most intelligent decision can be made by the state machine by observing the entire collection of measured values and relations of the measured values to one another. This consideration can be performed in a table driven manner where the table has enough entries that cover all possible scenarios that could be encountered and for each one it provides a decision concerning whether or not to increase the number of program pulses beyond the designated value (6 here) and by how many pulses. The entries in such a table have to be characterized in experiments performed on the chip.

In some embodiments, to integrate the current over the variable periods of different pre-charge times, current mirrors can be employed to mirror a current proportional to Icc but much smaller than Icc. The mirrored currents can be used to charge a capacitor that starts in a pre-discharged state at the onset of each pre-charge phase, and charges up in proportion to the Icc. The voltage value across the capacitor at the end of the pre-charge time can then be fed to an A/D converter in order to obtain a digital value. In order to provide a large dynamic range for sensing energy, multiple current mirroring can be done. For example, one current mirror may mirror $1/100$ of the Icc, the next mirror may simultaneously mirror $1/1000$ of the Icc, and a third mirror may mirror $1/10000$ of the Icc, etc. Each mirror can then charge its own dedicated capacitor. All the dedicated capacitors can be of equal size. Those currents that are too great will max out the capacitor voltage early in the integration time and their mirror(s) will fall out of range of their operations by coming out of the saturation region that they need to stay within in order to properly function as mirrors. The results of voltages read on such capacitors at the end of integration time can be ignored if the voltage is too close to rail voltage. Other mirrors may provide too little current to significantly charge their respective capacitors. But, there should exist at least one current mirror where the voltage developed on its capacitor is an intermediate voltage (not too close to ground and not too close to rail). That voltage on the capacitor connected to the output of that mirror is then providing the high resolution energy figure of merit that needs to be captured by A/D sampling of the capacitor voltage at the end of the particular pre-charge phase.

One embodiment includes an apparatus, comprising: a plurality of non-volatile memory cells; one or more control circuits connected to the memory cells and configured to perform programming of the memory cells; a power supply line connected to the one or more control circuits, the power supply line configured to provide a power supply to program the memory cells; and a current measurement circuit connected to the power supply line and the one or more control circuits. The current measurement circuit is configured to sense an indication of current on the power supply line. The one or more control circuits are configured to determine whether the programming of the memory cells is successful based on comparing the indication of current to a reference.

One embodiment includes an apparatus, comprising: a plurality of non-volatile memory cells; an input pad configured to receive a power source; means for measuring current drawn at the input pad; means for programming the memory cells; and means for determining whether programming of the memory cells is successful based on measured current drawn by the input pad.

One embodiment includes a method, comprising: programming a non-volatile memory apparatus including performing programming iterations for a plurality of non-volatile memory cells, each programming iteration includes a dose of programming; applying a lockout voltage to memory cells that have reached their programming target, the applying the lockout voltage causes a change in total current coming into the non-volatile memory apparatus from one or more supplies; measuring total current coming into the non-volatile memory apparatus from one or more supplies after multiple programming iterations to obtain a set of measured current values; and determining whether the programming completed successfully based comparing the set of measured current values to a set of reference current values.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. An apparatus, comprising:
a plurality of non-volatile memory cells;
one or more control circuits connected to the memory cells and configured to perform programming of the memory cells;
a power supply line connected to the one or more control circuits, the power supply line configured to provide a power supply to program the memory cells; and
a current measurement circuit connected to the one or more control circuits, the current measurement circuit configured to sense an indication of current on the power supply line, the one or more control circuits configured to determine whether the programming of the memory cells is successful based on comparing the indication of current to a reference.

2. The apparatus of claim 1, further comprising:
bit lines connected to the memory cells and the one or more control circuits, the one or more control circuits are configured to cause the bit lines to apply data dependent voltages to the memory cells during programming, the one or more control circuits are configured to cause the bit lines to carry a lockout voltage during programming to those memory cells that have been verified to have reached a target data state, transitioning the bit lines from data dependent voltages to the lockout voltage causes an increase in current on the supply line measured by the current measurement circuit.

3. The apparatus of claim 1, wherein:
the one or more control circuits are configured to perform programming of the memory cells by performing a predefined number of programming iterations, each programming iteration includes a dose of programming;
the current measurement circuit is configured to sense indications of current on the power supply line for multiple programming iterations; and
the one or more control circuits configured to determine whether the programming of the memory cells is successful based on the sensed indications of current for the multiple programming iterations.

4. The apparatus of claim 1, wherein:
the one or more control circuits are configured to perform programming of the memory cells by performing a fixed number of programming iterations;
the current measurement circuit is configured to sense indications of current on the power supply line for each of the programming iterations; and
the one or more control circuits configured to determine whether the programming of the memory cells is successful based on the sensed indications of current for the multiple programming iterations.

5. The apparatus of claim 1, wherein:
the one or more control circuits are configured to perform programming of the memory cells by performing a fixed number of programming iterations, each programming iteration includes a pre-charge phase, a program pulse, and at least one verify phase; and
the one or more control circuits are configured to raise a voltage of at least a subset of bit line voltages during the pre-charge phase, the raising of bit line voltages increases current on the power supply line.

6. The apparatus of claim 1, wherein:
the one or more control circuits are configured to perform programming of the memory cells by performing a fixed number of programming iterations, each programming iteration includes a pre-charge phase and a program pulse, at least a subset of the programming iterations include a verify phase;

the current measurement circuit is configured to sense indications of current on the power supply line at the pre-charge phase of each of the programming iterations; and the one or more control circuits are configured to determine whether the programming of the memory cells is successful based on the sensed indications of current for the multiple programming iterations.

7. The apparatus of claim 1, wherein:

the one or more control circuits are configured to perform programming of the memory cells by performing a fixed number of programming iterations, each programming iteration includes a pre-charge phase and a program pulse, at least a subset of the programming iterations include a verify phase;

the one or more control circuits are configured to raise at least a subset of bit line voltages during the pre-charge phase, the raising of bit line voltages increases current on the power supply line;

the current measurement circuit is configured to sense indications of current on the power supply line at the pre-charge phase of multiple programming iterations; and the one or more control circuits configured to determine whether the programming of the memory cells is successful based on the sensed indications of current for the multiple programming iterations.

8. The apparatus of claim 1, wherein:

the current measurement circuit is configured to sense information about current, compare the information to one or more compare values and determine a magnitude of current based on the comparing the information to one or more compare values.

9. The apparatus of claim 1, wherein:

the one or more control circuits are configured to stop the programming if the one or more control circuits determine that the programming of the memory cells is successful.

10. The apparatus of claim 1, wherein:

the one or more control circuits are configured to perform programming of the memory cells by performing a fixed number of programming iterations, each programming iteration includes a program pulse, at least a subset of the programming iterations include a verify phase; and the one or more control circuits are configured to apply an extra program pulse in response to determining that the programming of the memory cells is not successful based on the indication of current.

11. The apparatus of claim 1, further comprising:

a plurality of bit lines connected to the one or more control circuits; and a plurality of source lines connected to the one or more control circuits, the one or more control circuits are configured to cause the bit lines and the source lines to apply data dependent voltages to the memory cells during programming, the one or more control circuits are configured to cause the bit lines and the source lines to apply a lockout voltages to memory cells being locked out from programming, the lockout voltage is different than the data dependent voltages.

12. The apparatus of claim 1, further comprising:

a plurality of bit lines connected to the one or more control circuits; and a plurality of source lines connected to the one or more control circuits, the one or more control circuits are configured to apply data dependent voltages to the source lines and bit lines to concurrently program the memory cells to multiple data states and apply data dependent voltages to the source lines and bit lines to verify the memory cells for multiple data states without lowering source line voltages and bit lines when transitioning between programming and verifying.

13. The apparatus of claim 1, wherein:

non-volatile memory cells are arranged in a monolithic three dimensional memory structure.

14. An apparatus, comprising:

a plurality of non-volatile memory cells;

an input pad configured to receive a power source;

means for measuring current drawn at the input pad;

means for programming the memory cells; and means for determining whether programming of the memory cells is successful based on measured current drawn by the input pad.

15. The apparatus of claim 14, wherein:

the means for programming includes means for applying a lockout voltage to memory cells that have reached their programming target, applying the lockout voltage causes a change in current drawn at the input pad; and, the means for determining compares set of measured current values for current drawn at the input pad to a set of reference current values.

16. The apparatus of claim 15, wherein:

the means for programming applies a set of program pulses to the memory cells and pre-charges bit lines connected to the memory cells to data dependent voltages prior to the program pulses, the lockout voltage is applied to the bit lines by transitioning the bit lines from data dependent voltages to the lockout voltage; and means for measuring current drawn at the input pad samples the current drawn at the input pad when transitioning the bit lines from data dependent voltages to the lockout voltage.

17. A method, comprising:

programming a non-volatile memory apparatus including performing programming iterations for a plurality of non-volatile memory cells, each programming iteration includes a dose of programming;

applying a lockout voltage to memory cells that have reached their programming target, the applying the lockout voltage causes a change in total current coming into the non-volatile memory apparatus from one or more supplies;

measuring total current coming into the non-volatile memory apparatus from one or more supplies after multiple programming iterations to obtain a set of measured current values; and determining whether the programming completed successfully based comparing the set of measured current values to a set of reference current values.

18. The method of claim 17, wherein:

each programming iteration includes pre-charge phase and a program pulse after the pre-charge phase;

the applying the lockout voltage is performed during the pre-charge phase of the multiple programming iterations; and the measuring current is performed during the pre-charge phase of the multiple programming iterations.

19. The method of claim 17, wherein:
- the performing programming iterations includes performing a predefined number of programming iterations that each comprise applying a data dependent voltage to a bit line;
- the applying the lockout voltage includes changing the bit line from the data dependent voltage to the lockout voltage when a memory cell connected to the bit line reaches a target data state;
- the changing the bit line from the data dependent voltage to the lockout voltage causes an increase in current on a power supply line for the non-volatile memory apparatus; and
- the measuring current for the non-volatile memory apparatus includes detecting the increase in current on the power supply line.

20. The method of claim 19, further comprising:
- performing an additional programming iteration if the programming did not complete successfully, the predefined number of programming iterations and the additional programming iteration include applying a program pulse to multiple memory cells connected to a word line.

* * * * *